US007928770B1

(12) United States Patent
Bellis et al.

(10) Patent No.: US 7,928,770 B1
(45) Date of Patent: Apr. 19, 2011

(54) I/O BLOCK FOR HIGH PERFORMANCE MEMORY INTERFACES

(75) Inventors: Andrew Bellis, Surrey (GB); Philip Clarke, Surrey (GB); Joseph Huang, Morgan Hill, CA (US); Yan Chong, San Jose, CA (US); Michael H. M. Chu, Fremont, CA (US); Manoj B. Roge, San Jose, CA (US)

(73) Assignee: Altera Corporation, San Jose, CA (US)

( * ) Notice: Subject to any disclaimer, the term of this patent is extended or adjusted under 35 U.S.C. 154(b) by 615 days.

(21) Appl. No.: 11/935,347

(22) Filed: Nov. 5, 2007

Related U.S. Application Data

(60) Provisional application No. 60/857,277, filed on Nov. 6, 2006, provisional application No. 60/868,018, filed on Nov. 30, 2006.

(51) Int. Cl.
*H03K 19/096* (2006.01)

(52) U.S. Cl. ......... 326/96; 326/93; 326/38; 365/230.03; 365/189.05; 711/164; 713/400

(58) Field of Classification Search .............. 326/37–41, 326/47, 93, 95; 710/100, 60–61, 104, 105, 710/66, 127, 129, 305; 711/167, 154, 104–105, 711/109, 114, 150; 365/233, 230.08, 240, 365/230.02, 189.05, 189.12
See application file for complete search history.

(56) References Cited

U.S. PATENT DOCUMENTS

| | | | |
|---|---|---|---|
| 5,953,284 | A | 9/1999 | Baker |
| 6,041,417 | A | 3/2000 | Hammond et al. |
| 6,147,963 | A | 11/2000 | Walker et al. |
| 6,338,127 | B1 | 1/2002 | Manning |
| 6,640,277 | B1 * | 10/2003 | Moertl ........................... 710/305 |
| 6,647,523 | B2 | 11/2003 | Manning |
| 7,437,500 | B2 * | 10/2008 | Butt et al. ...................... 711/105 |
| 7,493,461 | B1 * | 2/2009 | Thorne .......................... 711/167 |
| 2001/0046163 | A1 * | 11/2001 | Yanagawa ..................... 365/194 |

OTHER PUBLICATIONS

U.S. Appl. No. 11/040,324, Thorne.

* cited by examiner

*Primary Examiner* — James H. Cho
*Assistant Examiner* — Christopher Lo
(74) *Attorney, Agent, or Firm* — Ropes & Gray LLP

(57) ABSTRACT

I/O blocks include input, output, and output enable circuits for interfacing with memory devices. The input circuit includes registers for capturing a double data rate signal, converting it into single data rate signals, and resynchronizing the single data rate signals. Multiple devices may be accessible with each device potentially having a different clock signal for resynchronizing. Another clock signal may be used to align/synchronize resulting signals from multiple devices. The resynchronized single rate signals can be converted into half-rate data signals, and the four half-rate data signals can be provided to resources in the programmable device core. The input circuit also may provide a half-rate clock signal synchronized with the half-rate data signals to the programmable device core. The half rate clock signal can be derived from the full-rate clock signal using a data strobe signal, a full-rate clock signal, or a half-rate clock signal as an input.

21 Claims, 12 Drawing Sheets

I/O BLOCK FOR HIGH PERFORMANCE MEMORY INTERFACES

CLAIM OF PRIORITY

This application claims the benefit of U.S. Provisional Application No. 60/868,018 filed Nov. 30, 2006, entitled "DDR1 AND DDR2 MEMORY INTERFACE FOR PROGRAMMABLE DEVICES," by Andrew Bellis et al. and U.S. Provisional Application No. 60/857,277 filed Nov. 6, 2006, entitled "IO BLOCK FOR HIGH PERFORMANCE DDR3 MEMORY INTERFACES IN A FPGA," by Andrew Bellis et al., the disclosures of which are incorporated herein by reference in its entirety.

CROSS-REFERENCES TO RELATED APPLICATIONS

This application is related to concurrently filed and commonly owned U.S. patent application "READ-LEVELING IMPLEMENTATIONS FOR DDR3 APPLICATIONS ON AN FPGA," by Michael H. Chu et al. (Ser. No. 11/935,310), which is incorporated by reference for all purposes.

BACKGROUND OF THE INVENTION

Embodiments of the present invention relate to the field programmable logic devices, and in particular to high performance memory interfaces.

Programmable devices, such as FPGAs, typically include a programmable device core and one or more input/output (I/O) banks. The programmable device core includes thousands of programmable logic cells that use combinations of logic gates and/or look-up tables to perform logic operations. Programmable devices also include a number of functional blocks having specialized logic devices adapted to specific logic operations, such as adders, multiply and accumulate circuits, phase-locked loops, and one or more embedded memory array blocks. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

Programmable devices include one or more input/output (I/O) banks for communication with external devices, such as memory devices, network interfaces, data buses and data bus controllers, microprocessors, other programmable devices, ASICs, or any other type of electronic device. Each I/O bank is connected with a number of conductive I/O pins, balls, or other electrical connectors in the programmable device chip package. An I/O bank includes logic for sending and receiving data signals, control signals, clock signals, power and ground signals, or any other type of signal used in conjunction with communications between the programmable device and an external device.

The I/O banks of a programmable device include logic, amplifiers, filters, and other circuits that together can be configured to provide one or more standard interfaces between the programmable device and external devices. Additionally, the I/O banks of a programmable device can be configured to provide custom or proprietary interfaces if required by a particular application.

Double data rate (DDR) memory interfaces are one type of interface that can be implemented with programmable devices. Double data rate interfaces typically provide two bits of data for each clock cycle of a control signal. For example, a double data rate interface can capture or output a first bit on a rising edge of the control signal and capture or output a second bit on the falling edge of the control signal. With this approach, the data is communicated at twice the frequency of the control signal.

The I/O banks of a programmable device include registers for capturing and outputting double data rate signals. These registers typically convert each double data rate input signal into two data signals at the frequency of the data strobe signal and convert two output data signals at the frequency of the data strobe signal into a single double data rate output signal. In previous programmable devices, other functions of the double data rate interface are implemented in the programmable device core using programmable logic cells and other resources. These other functions can include synchronizing input data signals with the clock signal of the programmable device and synchronizing output data signals with the data strobe signal of the double data rate interface.

To perform these functions in the programmable device core of a programmable device, at least a portion of the programmable logic of the programmable device core must operate at the frequency of the data strobe signal of the double data rate interface. For example, for double data rate outputs, the programmable device core must provide data to the registers of the I/O banks at the frequency of the data strobe signal. For double data rate inputs, the registers of the I/O banks provide data to the programmable device core at the frequency of the data strobe signal. Additionally, as timing closure becomes ever more difficult the write data and read datapaths of the memory controller design need to change from operating at the same frequency as the attached DDR or quad data rate (QDR) (or other formats) memory device to a half-rate datapath that operates at half the frequency of the attached memory devices.

As double data rate memory interfaces operate at ever increasing frequencies, it becomes more difficult for the programmable logic resources of the programmable device core to keep pace. For example, the DDR2 memory specifications allow for data rates up to 800 Mbs or more, which corresponds to a control signal frequency of 400 Mhz. DDR3 memory specifications offer higher performance with 600 Mbs to 1.6 Gbs data rate, and QDR and Reduced Latency dynamic random access memory (RLDRAM) operating at 133 MHz to 533 MHz.

Even when programmable logic resources in the programmable device core can operate at sufficient speeds, the memory interface logic in the programmable device core often consumes substantial logic resources and high speed routing connections. As a result, there are less programmable device resources available for implementing the remainder of the design. This makes it more difficult or impossible to implement complicated and/or high speed designs including double data rate interfaces using programmable devices. For example, a 72-bit DDR read and write interface can utilize around 600 programmable device core registers, which can vary depending on configuration.

The core registers used for these functions will introduce timing constraints on other portions of the design, potentially limiting its maximum operating frequency and increasing the amount of time compilation software must process and optimize the design for the programmable device. Additionally, the routing connections between the capture registers in I/O banks and programmable logic resources are relatively long. As a result, these routing connections are often subject to substantial process, voltage, and temperature variations that must be taken into account. These variations and the timing margins required to overcome them often limit the maximum operating frequency of the design implemented with the programmable device.

It is therefore desirable for a programmable device to include I/O blocks optimized for double data rate communications to minimize the required amount of programmable device core logic resources. It is further desirable that the programmable device include I/O blocks with smaller process, voltage, and temperature variations, allowing for larger timing margins and faster operating frequencies. It is also desirable for the programmable device to include I/O blocks that can be flexibly configured to allow for simple integration with a variety of different types of designs, including DDR1-3 and QDRI-II, and RLDRAMI-II, as well as other QDRII variants such as QDRII+ and QDRIII.

BRIEF SUMMARY OF THE INVENTION

Embodiments of the present invention provide methods, circuits, and systems for input/output (I/O) blocks in high performance memory interfaces. Embodiments reduce the number of core registers used by providing resynchronization registers within an I/O block of a programmable logic device. The resynchronization registers along with other I/O circuitry can provide flexibility to be used in multiple interfaces, including read and write leveling for DDR3, which can require complex clock generation. The I/O block may further include half-rate registers for providing data to the core and/or include half-rate registers for providing to output circuitry/pins data signals from the core that are clocked at half the frequency of the double data rate interface.

According to an exemplary embodiment, I/O blocks include input, output, and output enable circuits for interfacing with memory devices. In one embodiment, an input circuit includes registers for capturing a double data rate signal, converting it into single data rate signals, and resynchronizing the single data rate signals. Multiple devices may be accessible, where each device potentially has a different clock signal for resynchronizing input data signal from that device. Another zero phase clock signal may be used to align/synchronize resulting signals from multiple devices. The different clock signals may be derived from the zero-phase clock signal using a delay chain (e.g. a PVT compensated delay chain controlled by a DLL), where an appropriate phase is chosen for the input circuits that receive input signals from a particular device. Signal selection devices provide multiple modes of operation. In one aspect, the PVT compensated delay chains are known as read and write leveling delay chains.

In an embodiment, the single rate signals can be converted into half-rate data signals using a set of half-rate registers, and the four half-rate data signals can be provided to resources in the programmable device core. The input circuit also may provide a half-rate clock signal synchronized with the half-rate data signals to the programmable device core. In some embodiments, the half-rate clock signal is derived from the full-rate clock signal using a data strobe signal, a full-rate clock signal from the core or from a read leveling delay chain.

In another embodiment, an output circuit of an I/O block includes half-rate data registers for converting four half-rate data signals to two single rate data signals at the full-rate frequency and includes DDR registers that create a double data rate output signal. In yet another embodiment, registers are used to synchronize the two full rate data signals with a clock signal used for multiple DQS groups, and other registers may be used to align the data signals of a group with a particular clock for the DDR output registers of that group. The output circuit can use a write leveling delay chain to provide the clock signal for the DDR output registers of a particular group. In one aspect, a group shares a write leveling delay chain.

A better understanding of the nature and advantages of the present invention may be gained with reference to the following detailed description and the accompanying drawings.

DETAILED DESCRIPTION OF THE INVENTION

Embodiments of the present invention provide methods and circuits for input/output (I/O) blocks in high performance memory interfaces, such as DDR, QDR, and RLDRAM, and variants thereof. Embodiments reduce the number of core registers by providing resynchronization registers within an I/O block of a programmable logic device (PLD). The resynchronization registers along with other I/O circuitry provide flexibility for use in multiple interfaces, including read and write leveling for DDR3. Embodiments provide write and read leveling delay chains in generating process, voltage and temperature (PVT) compensated clocks for use in multiple interfaces. An I/O scanchain may be used to dynamically configure the different topologies and clocks. The I/O block may further include half-rate registers for increasing the width of the incoming data (the frequency being half the full-rate clock frequency) and/or other half-rate registers for decreasing the width of the outgoing data, which provides, for example, the advantage of timing closure. Although embodiments are described with respect to PLDs, other circuits such as ASICS may benefit from embodiments of the present invention.

The following discussion presents aspects of an I/O block first with regards to DDR1 and DDR2 operation, and then DDR3 operation, and then QDR and RLDRAM operation. The discussion of each type of operation is applicable to other modes. The DDR1 and DDR2 discussion presents some overarching aspects of an I/O block according to an embodiment of the present invention, including synchronization, conversion to a half-rate clock, and examples of different modes available. For DDR3, registers and clock generation related to read and write leveling and write margining, which provide accurate timing, are described. For QDR and RLDRAM, aspects of the clock circuitry for these interfaces are described as it relates to the previous discussion.

I. DDR1 and DDR2

A. Input

Figure 1:
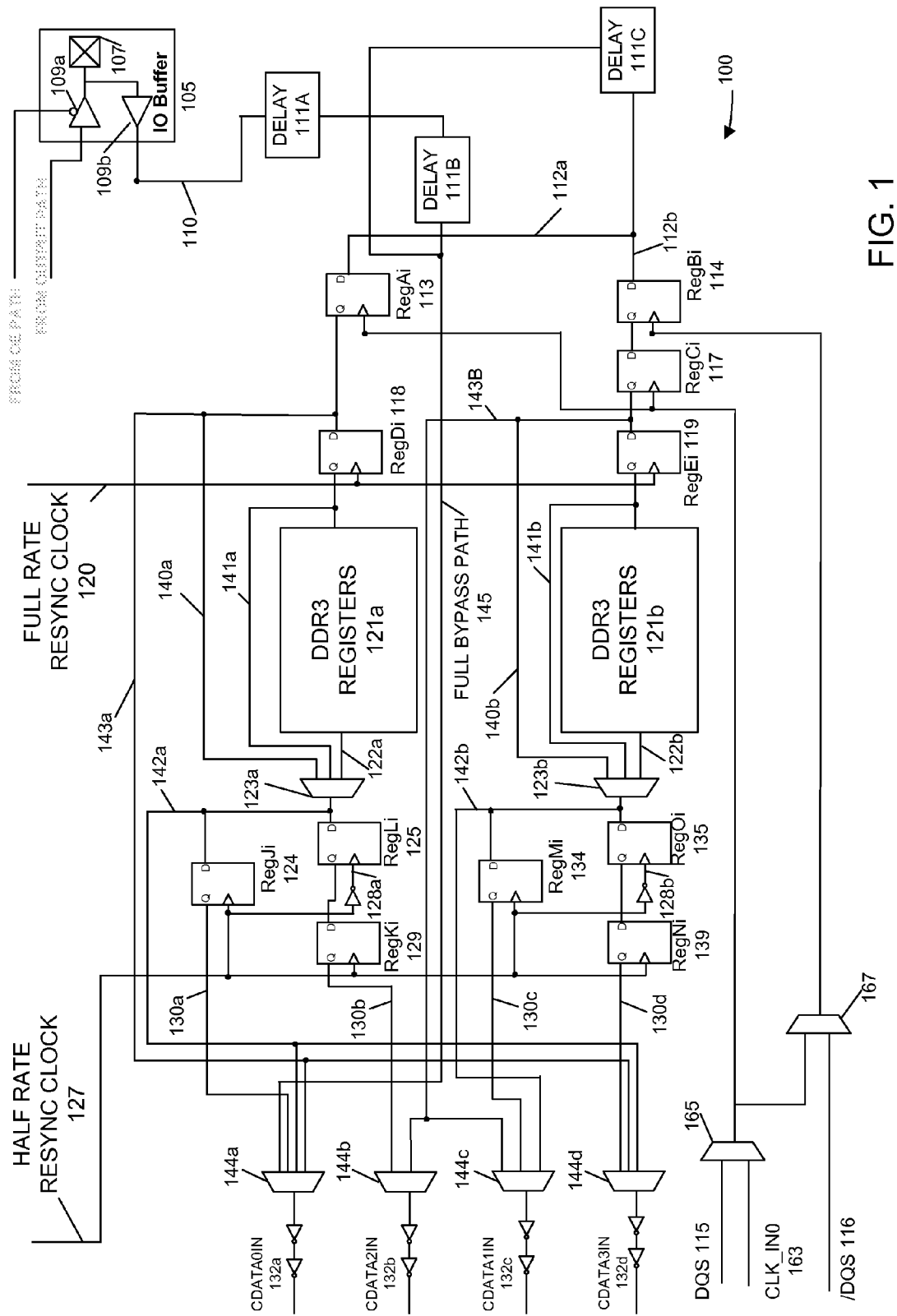
FIG. 1 illustrates a double data rate input circuit of an I/O block according to an embodiment of the invention.

FIG. 1 illustrates a double data rate input circuit 100 of an I/O block according to an embodiment of the invention. Circuit 100 includes a connection with an I/O buffer circuit 105. I/O buffer circuit 105 includes an I/O pin 107 connected with output buffer 109a and input buffer 109b, allowing I/O pin 107 to be used as an output or, in the conjunction with input circuit 100, as an input. A typical I/O block of a programmable device will have many I/O pins, and thus may include many instances of circuit 100 operating in parallel. In some embodiments employing, for example, all variants of QDR or SIO RLDRAM I-II, data I/O pins 107 are only connected to an input buffer or an output buffer, although there are typically twice as many pins.

1. Synchronization

When buffer 109b is activated, a data signal received by pin 107 is carried by connection 110 through programmable delays 111a, 111b, and 111c. Programmable delays 111a, 111b, and 111c can be configured to delay the data signal to compensate for skew and to align the data signal with other control and data signals. In one embodiment, delay 111c is controlled with a dedicated I/O block control scanchain.

After passing through programmable delays 111a, 111b, and 111c, the data signal is split by signal paths 112a and 112b. Signal path 112a carries the data signal to the input of register Ai 113 and signal path 112b carries the data signal to the input of register Bi 114. Register Ai 113 is clocked by a data strobe signal 115. Data strobe signal 115 is synchronized with the memory interface and the data signals received by the pin 107 and operates at a full rate frequency, which corresponds with the frequency of the memory interface. Typically, the data strobe signal 115 is transmitted by the memory to which the input circuit 100 is interfacing. In other embodiments, a clock signal 163 is used instead of DQS signal 115. This may be accomplished with multiplexer 165. In one embodiment, this is done when the IO is configured for non-memory applications and the user wants a register in the IO that is clocked using a clock derived in the core.

In an embodiment, the rising and falling edges of data strobe signal 115 are offset from the edges of each pair of first and second bits of the data signal received by pin 107. In one embodiment, the offset is created by a DQS delay, which may use a PVT compensated delay chain controlled by a DLL. This allows registers synchronized with the data strobe signal 115 to capture a first and a second bit of data in each cycle of the data signal.

In some embodiments using DDR1-3 and RLDRAMI-II interfaces, RegBi 114 is clocked by DQS signal 115. In other embodiments, such as QDR based memory interfaces, register Bi 114 can be clocked by 116 which is the complement of data strobe signal 115. The selection of signal 116 may be accomplished with multiplexer 167. In one aspect, signal 116 is offset from the edges of each pair of first and second bits of the data signal received by pin 107. In one embodiment where /DQS is complementary and is a separate input, as for QDR based memory interfaces, the offset is created by a DQS delay, which may use a PVT compensated delay chain controlled by a DLL.

In one embodiment using QDRII, register Ai 113 captures the data signal on path 112a on a first edge of the data strobe signal 115 associated with the first read beat of data. Because the data strobe signal 115 has a first edge, such as a rising edge or falling edge, aligned with a first bit in each pair of bits of the data signal, register Ai 113 will capture the odd numbered bits of a double data rate signal. Similarly, register Bi 114 captures the data signal on path 112b on a first edge of inverse clock signal 116, which corresponds with the second edge of the data strobe signal 115. Thus, register Bi 114 will capture the even numbered bits of a double data rate signal.

In other embodiments, register Bi 114 will capture the odd numbered bits and register Ai 113 will capture the even numbered bits. One skilled in the art will appreciate how the discussion differs between the two methods. In one embodiment, register Bi 114 always receives the odd bits of data.

The output of register Bi 114 is provided to the input of register Ci 117. Register Ci is clocked by the data strobe signal 115 and thus captures the value of register Bi 114 on the second edge of the data strobe signal 115. Thus, register Ci 117 synchronizes the bits of the data signal with the second edge of data strobe signal 115. As a result, the outputs of registers Ai 113 and Ci 117 are synchronized, with register Ci 117 providing its bits of the data signal at the same time that register Ai 113 provides its bits of the data signal.

The outputs of registers Ai 113 and Ci 117 are provided to the inputs of registers Di 118 and Ei 119, respectively. Registers Di 118 and Ei 119 are clocked by a resynchronization clock signal 120. Although resynchronization clock signal 120 operates at the same frequency as the data strobe signal 115, the resynchronization clock signal 120 is generated by the programmable device and thus is synchronized with the programmable device logic, rather than the memory interface, as with data strobe signal 115. In an embodiment employing a free-running data strobe, such as in QDR or RLDRAM based memory interfaces, the data strobe signal can be used as the resynchronization clock signal 120.

Resynchronization clock signal 120 can be generated by a phase locked loop or any other type of clock generation circuit known in the art. Registers Di 118 and Ei 119 capture the values of registers Ai 113 and Ci 117 in synchrony with resynchronization clock signal 120. Thus, the outputs of registers Di 118 and Ei 119 are the odd/even and even/odd bits, respectively, of the data signal synchronized with the programmable device, rather than the memory interface. DDR3 registers 121a,b will be discussed later.

2. Half-Rate Registers

When the input circuit 100 is configured to reduce by half the frequency of the single data signals, which are running at full clock frequency, half-rate registers are employed. A first set of half-rate registers includes register Ji 124, register Li 125, and register Ki 129. A second set of half-rate registers includes register Mi 134, register Oi 135, and register Ni 139.

Register Ji 124 is clocked by a half rate resynchronization clock signal 127, which operates at half the frequency of the resynchronization clock signal 120. Register Li 125 is clocked by the inverse 128a of the half rate resynchronization clock signal 127, which is 180 degrees out of phase with the half rate resynchronization clock signal 127. As a result, registers Ji 124 and Li 125 capture alternate odd/even bits of the data signal.

The output of register Li 125 is provided to register Ki 129, which synchronizes bits from register Li 125 with the half rate resynchronization clock signal 127 in a similar manner as register Ci 117 discussed above. Thus, the outputs of registers Ji 124 and Ki 129 are two data signals 130*a* and 130*b*, corresponding with successive odd/even numbered bits of the data signal, synchronized with the half rate resynchronization clock signal 127. These data signals 130*a* and 130*b* are provided to the programmable device core via connections 132*a* and 132*b*.

Similarly, multiplexer 123*b* passes the data signal on signal path 122*b* through to registers Mi 134 and Oi 135. Register Mi 134 is clocked by a half rate resynchronization clock signal 127, which operates at half the frequency of the resynchronization clock signal 120. Register Oi 135 is clocked by the inverse 128*b* of the half rate resynchronization clock signal 127, which is 180 degrees out of phase with the half rate resynchronization clock signal 127. As a result, registers Mi 134 and Oi 135 capture alternate even/odd bits of the data signal.

The output of register Oi 135 is provided to register Ni 139, which synchronizes bits from register Oi 135 with the half rate resynchronization clock signal 127 in a similar manner as register Ki 129 discussed above. Thus, the outputs of registers Mi 134 and Ni 139 are two data signals 130*c* and 130*d*, corresponding with successive even/odd numbered bits of the data signal, synchronized with the half rate resynchronization clock signal 127. These data signals 130*c* and 130*d* are provided to the programmable device core via connections 132*c* and 132*d*. Thus, in one mode of operation of circuit 100, the connections 132*a*-132*d* provide four sequential bits of the data signal in parallel to the programmable device core at the frequency of the half rate resynchronization clock signal 127.

3. Modes and Bypassing

Many modes of operation are capable via the multiplexers 123*a,b* and 144*a-d*. The following are a few examples of the different modes of operation available. In a first mode of operation of circuit 100, the data signal from pin 107 is provided directly to the programmable device core via full bypass path 145, multiplexer 144*a*, and connection 132*a*. This first mode of operation allows the programmable device core to perform all of the functions of the I/O interface, which enables compatibility with any type of interface capable of being implemented using programmable logic resources in the programmable device core. In one embodiment, another bypass signal, which has a different delay, is transferred from pin 107 to another connection, e.g. 132*c*. In one embodiment, the selection of the bypass signal can be controlled dynamically by the I/O block scan chain. In another embodiment, the selection is done statically. The selection of which bypass signal to use may be determined based on routing and timing considerations.

In a second mode of operation, the data signals from the capture registers Ai 113 and Ci 117 bypass the other circuitry in the input circuit 100 by passing directly along paths 143*a* and 143*b* to connections 132*a*, 132*d* and 132*b*,132*c*, respectively. In one embodiment, the bypass path 143*a* transmits data from register Ai 113 to multiplexers 144*a* and 144*d*, which may be configured to pass these signals to connections 132*a* and 132*d*, respectively.

In another embodiment, the bypass path 143*b* transmits data from register Ci 117 to multiplexers 144*b* and 144*c*, which may be configured to pass these signals to connections 132*b* and 132*c*, respectively. The selection of which connection to use may be determined, for example, for routing and timing purposes. As described herein, in some embodiments, a bypass paths may be sent to more than one connection, for example, to provide flexibility in timing and routing. Thus, synchronization, DDR3 support, or reduction to a half data rate may be performed in the core, if needed.

In a slightly different bypass path for the second mode, multiplexers 123*a* and 123*b* can be configured to select the data signals from first bypass signal paths 140*a* and 140*b*. In conjunction with bypass paths 142*a* and 142*b* and multiplexers 144*a*, 144*d* and 144*c* respectively, the data signals pass directly from the outputs of capture registers Ai 113 and Ci 117 to the programmable device core via connections 132*a*, 132*d* and 132*c*. In one embodiment, the bypass path 142*a* transmits data to multiplexers 144*a* and 144*d*, which may be configured to pass these signals to connections 132*a* and 132*d*, respectively. In another embodiment, the bypass path 142*b* only transmits data to multiplexer 144*c*. In one aspect, the second mode of operation allows for design flexibility by providing data signals to the programmable logic resources in the programmable device core synchronized with the data strobe clock signal 115.

In a third mode of operation, data is resynchronized by registers Di 118 and Ei 119 and then the DDR3 circuitry is bypassed by using paths 141*a,b* as selected by multiplexer 123*a,b*. Then paths 142*a,b* may be used to bypass the half-rate circuitry. In one aspect, the third mode of operation provides data signals to the programmable logic resources in the programmable device core synchronized with the full rate resynchronization clock signal 120.

In a fourth mode of operation, the data signals along bypass paths 141*a,b* are sent to the half data rate circuitry. Thus, the connections 132*a*-132*d* would then provide four sequential bits of the data signal in parallel to the programmable device core at the frequency of the half rate resynchronization clock signal 127.

If the memory interface is a DDR3 standard memory interface, the outputs of registers Di 118 and Ei 119 can be provided to DDR3 registers 121*a* and 121*b* for additional processing. In the case of DDR1, DDR2, or other double data rate interfaces, the outputs of registers Di 118 and Ei 119 can pass through the DDR3 registers 121*a* and 121*b* unchanged or through the above-mentioned by pass paths. The outputs 122*a* and 122*b* of DDR3 registers 121*a* and 121*b* are provided to multiplexers 123*a* and 123*b*, respectively.

In a fifth mode of operation, multiplexers 123*a* and 123*b* can be configured to select the data signals from signal paths 122*a* and 122*b*. These signals are then provided via bypass paths 142*a* and 142*b* and multiplexers 144*a*, 144*d* and 144*c* to the programmable device core via connections 132*a*, 132*d* and 132*c*, respectively. In a sixth mode of operation, multiplexer 123*a* passes the data signal on signal path 122*a* through to registers Ji 124 and Li 125. The output of register Li 125 is provided to register Ki 129, which synchronizes bits from register Li 125 with the half rate resynchronization clock signal 127. Similarly, multiplexer 123*b* passes the data signal on signal path 122*b* through to registers Mi 134 and Oi 135. The output of register Oi 135 is provided to register Ni 139, which synchronizes bits from register Oi 135 with the half rate resynchronization clock signal 127. Thus, four sequential bits of the data signal are provided in parallel to the programmable device core at the frequency of the half rate resynchronization clock signal 127.

Embodiments of a programmable device can specify the use of any of these modes or any other mode of the I/O block statically or dynamically. In static configurations, configuration data used to specify the function of the programmable device also specifies the mode of the input circuit 100 of the I/O block. In dynamic configurations, control logic implemented in the programmable device core specifies the mode of input circuit 100 of the I/O block. In dynamic configurations, the mode of input circuit 100 of the I/O block can be changed at any time.

Circuit 100 is advantageous over prior memory interface circuits for programmable devices because it does not require any programmable logic resources of the programmable device core to handle data capture, output, and synchronization functions. Moreover, the programmable device core only needs to operate at the frequency of the half rate resynchronization clock signal, rather than at twice this frequency. Furthermore, the signal paths between the capture registers and the resynchronization registers is fixed and relatively short. As a result, these signal paths have minimal process, voltage, and temperature variations and timing margins can be increased accordingly, allowing a higher fmax to be achieved.

B. Output

Figure 2:
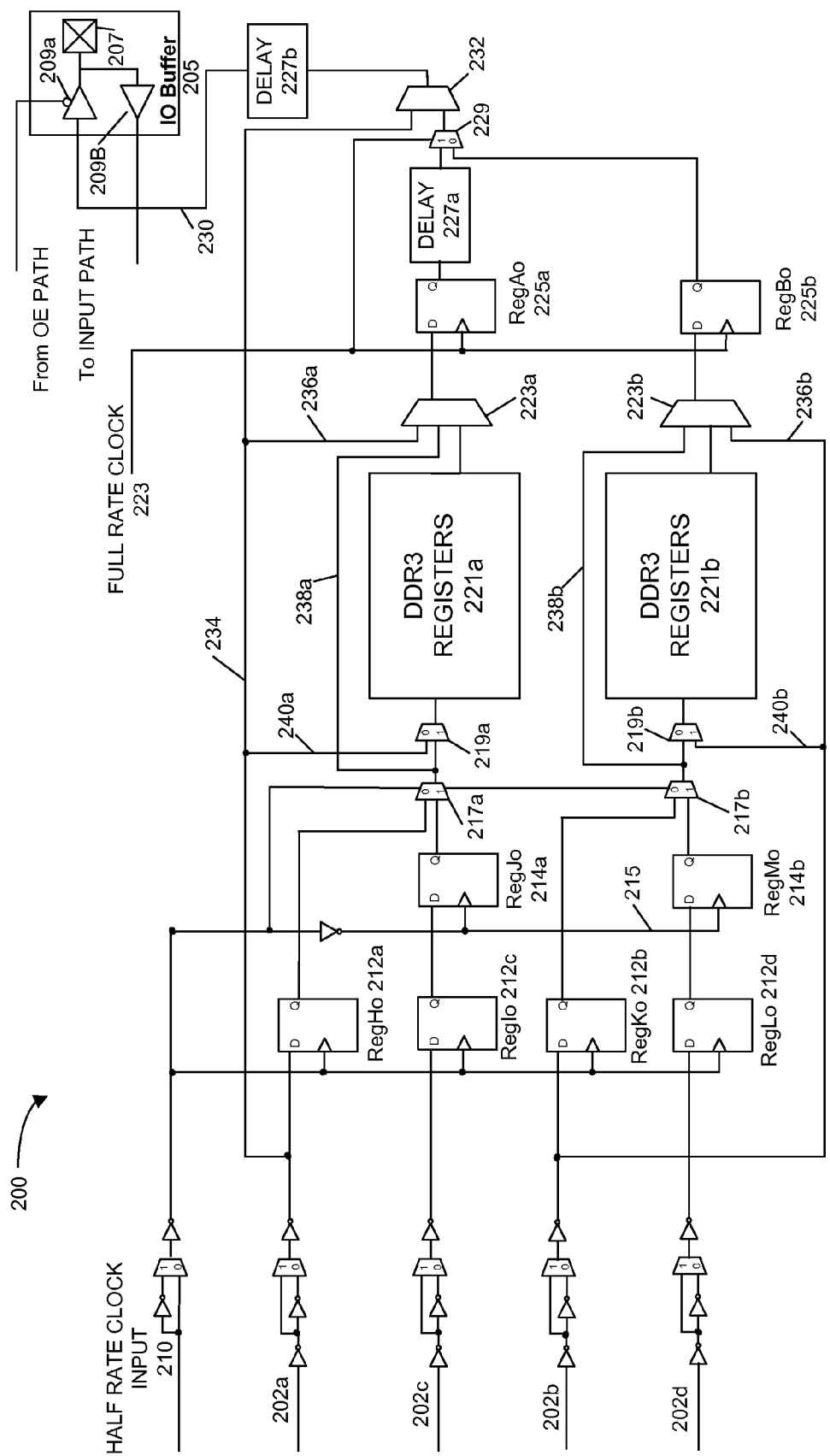
FIG. 2 illustrates a double data rate output circuit of an I/O block according to an embodiment of the invention.

FIG. 2 illustrates a double data rate output circuit 200 of an I/O block according to an embodiment of the invention. Circuit 200 can receive four bits of data in parallel from the programmable device core of a programmable device via connections 202a, 202b, 202c, and 202d. Connections 202a, 202b, 202c, and 202d provide the first, second, third, and fourth bits to be output for each pair of clock cycles of the memory interface bus. Additionally, circuit 200 receives a half rate resynchronization clock signal 210 from the programmable device core. The half rate resynchronization clock signal 210 operates at half the frequency of the double data rate interface and can be created using a phase locked loop or any other type of clock generation circuit known in the art.

Data signals on connections 202a, 202b, 202c, and 202d are connected with the inputs of registers Ho 212a, Ko 212b, Io 212c, and Lo 212d, respectively. Registers Ho 212a, Ko 212b, Io 212c, and Lo 212d are clocked by the half rate resynchronization clock signal 210. Additionally, the outputs of registers Io 212c and Lo 212d are connected with registers Jo 214a and Mo 214b, respectively. Registers Jo 214a and Mo 214b are clocked by an inverted version 215 of the half rate resynchronization clock signal 210, which is 180 degrees out of phase from the half rate resynchronization clock signal 210. Thus, registers Jo 214a and Mo 214b phase shift the data bits received from connections 202c and 202d by 180 degrees relative to the data bits received via connections 202a and 202b.

The outputs of registers 212a and 214a are connected to multiplexer 217a. Multiplexer 217a is controlled by the half rate resynchronization clock signal 210. Thus, the output of multiplexer 217a alternates between a first bit provided by connection 202a and a third bit provided by connection 202c. Similarly, the outputs of registers 212b and 214b are connected to multiplexer 217b. Multiplexer 217b is controlled by the half rate resynchronization clock signal 210. Thus, the output of multiplexer 217b alternates between a second bit provided by connection 202b and a fourth bit provided by connection 202d. The operation of multiplexers 217a and 217b converts four bits of data at the half rate frequency into two double data rate signals at the half rate frequency, each of which communicates two bits of data per each half rate resynchronization clock signal cycle. Thus, it may be viewed as single rate data at the full rate clock.

If the memory interface is a DDR3 standard memory interface, the outputs of multiplexers 217a and 217b are provided to DDR3 registers 221a and 221b, respectively, for additional processing. In the case of DDR1, DDR2, or other double data rate interfaces, the outputs of multiplexers 217a and 217b may be connected directly with registers Ao 225a and Bo 225b, respectively. Registers Ao 225a and Bo 225b are clocked with a full rate clock signal 223, which can be generated by a phase-locked loop or other clock generation circuit in the programmable device core or the I/O block. The full rate clock signal 223 operates at twice the frequency of the half rate resynchronization clock signal 210. Registers Ao 225a and Bo 225b capture and synchronize the outputs of multiplexers 217a and 217b with the full rate clock signal 223.

The output of register Ao 225a is connected through programmable delay 227a with multiplexer 229. The output of register Bo 225b is also connected with multiplexer 229. Multiplexer 229 is controlled by the full rate clock signal 223. The output of multiplexer 229 alternates between the signals provided by the outputs of register Ao 225a and Bo 225b. Thus, the output of multiplexer 229 will be a double data rate signal at the full rate frequency. For each pair of clock cycles of the half rate resynchronization clock signal 210, the output of the multiplexer 229 will be the first bit provided by connection 202a, followed by the second bit provided by connection 202b, the third bit provided by connection 202c, and then the fourth bit provided by connection 202d.

The output of multiplexer 229 then passes through multiplexer 232 and programmable delay 227b and along signal path 230 to I/O buffer circuit 205. I/O buffer circuit 205 can then output these signals. I/O buffer circuit 205 includes an I/O pin 207 connected with output buffer 209a and input buffer 209b, which allows I/O pin 207 to be used as an input, in conjunction with circuit 100 discussed above, or an output, in the conjunction with output circuit 200. A typical I/O block of a programmable device will have many I/O pins, and thus may include many instances of circuit 200 operating in parallel.

When buffer 209a is activated, the data signal on signal path 230 is output by pin 207 to a data bus connecting the programmable device with external memory devices or other types of devices. Programmable delays 227a and 227b, which can be controlled using the IO control scanchain, can configured to delay the data signal to compensate for skew and to align the data signal with other control and data signals.

In a first mode of operation, multiplexer 232 uses bypass path 234 to directly connect a data signal received from the programmable device core via connection 202a with signal path 230. In this first mode of operation, the programmable logic resources of the programmable device core perform all of the functions of the I/O interface. This enables the programmable device to be compatible with any type of interface capable of being implemented using programmable logic resources in the programmable device core.

In a second mode of operation, multiplexers 223a and 223b use bypass paths 236a and 236b, respectively. In this manner, registers Ao 225a and Bo 225b capture the data from connections 202a and 202b and synchronize the outputs with the full rate clock signal 223.

In one embodiment, the data on connections 202a and 202b are full data rate signals (i.e. one bit per clock cycle) operating at the full rate frequency. The output of multiplexer 229 is then a double data rate signal of the two signals on connections 202a and 202b.

In a third mode of operation, multiplexers 219a and 219b use bypass paths 240a and 240b, respectively. In this manner, DDR3 registers 221a and 221n can be accessed without having to utilize the half rate circuitry.

In a fourth mode of operation, the data signals on connections 202a-202d are converted into two full rate signals at the full rate clock frequency by multiplexers 217a and 217b. Multiplexers 223a and 223b then use bypass paths 238a and 238b, respectively to bypass the DDR3 registers.

In a fifth mode of operation, the data signals on connections 202a-202d are converted into two full rate signals at the full rate clock frequency by multiplexers 217a and 217b, and the resulting signals are transmitted through the DDR3 registers and multiplexers 223a and 223b to the registers Ao 225a and Bo 225b.

Embodiments of a programmable device can specify the use of the above modes or any other mode of the I/O block statically or dynamically. In static configurations, configuration data used to specify the function of the programmable device also specifies the mode of the output circuit 200 of the I/O block. In dynamic configurations, control logic implemented in the programmable device core specifies the mode of output circuit 200 of the I/O block. In dynamic configurations, the mode of output circuit 200 of the I/O block can be changed at any time, which can be done using the IO scanchain control block.

Bypasses may also be performed within the DDR3 registers blocks as will be described later.

C. Clock Generation

Figure 3:
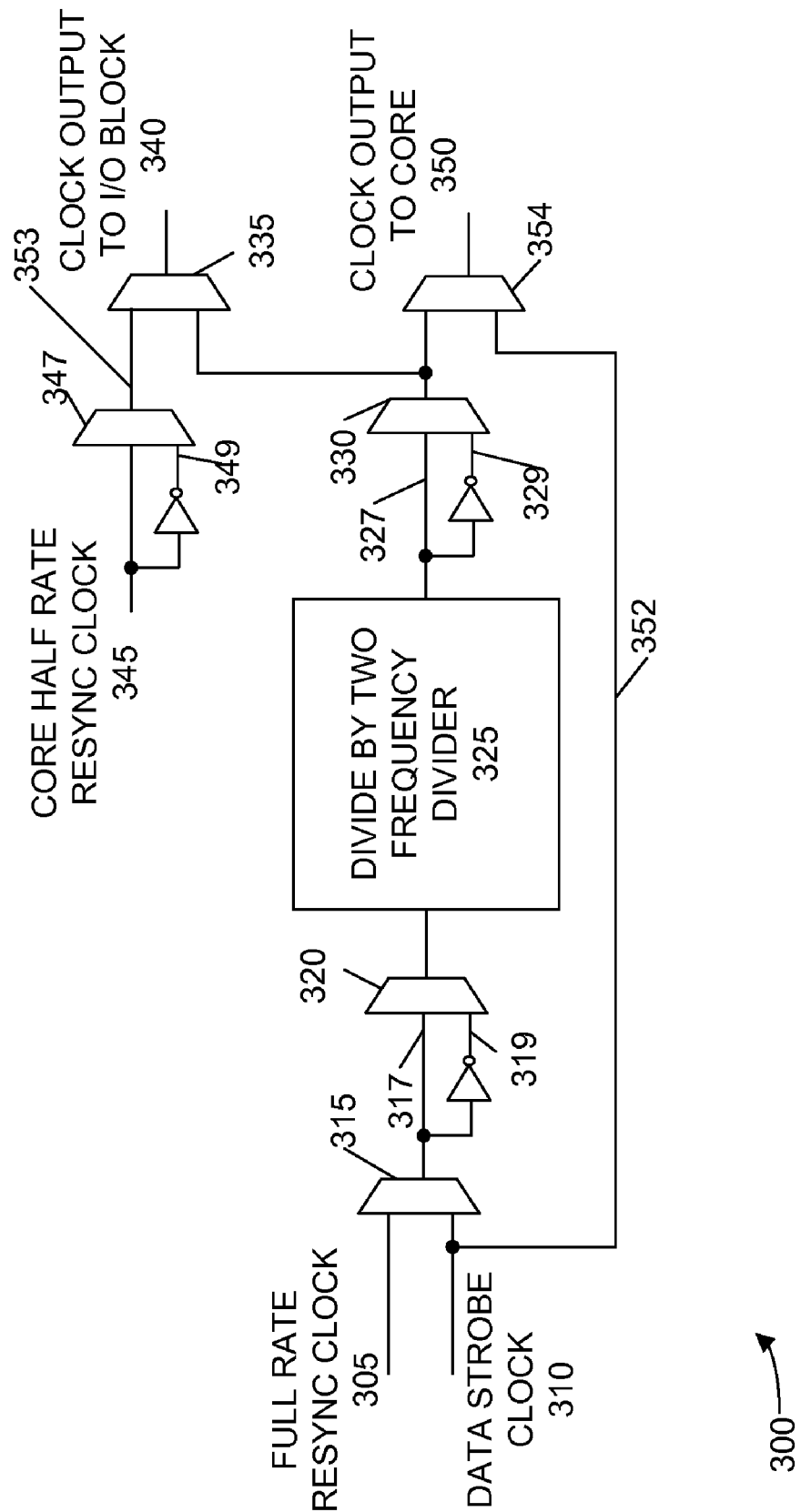
FIG. 3 illustrates a clock signal generation circuit according to an embodiment of the invention.

FIG. 3 illustrates a clock signal generation circuit 300 according to an embodiment of the invention. Clock signal generation circuit 300 is adapted to produce a half rate resynchronization clock signal suitable for synchronizing the transfer of data from an I/O block to the programmable device core, such as the half rate resynchronization clock 127.

Circuit 300 includes a first clock signal input 305 adapted to receive a full rate resynchronization clock signal. The full rate resynchronization clock signal can be generated using a phase-locked loop located in the programmable device core. The circuit 300 also includes a second clock signal input 310 adapted to receive a data strobe clock signal generated by the I/O block. A multiplexer 315 can select between the first input 305 and the second input 310 to provide flexibility in implementing designs using the programmable device. In one embodiment, the full-rate resynchronization clock can come from the read leveling delay chain(s), e.g., in a DDR3 mode.

The output 317 of multiplexer 315 is provided to multiplexer 320. Multiplexer 320 can select between the signal at output 317 or the inverse 319 of the signal 317. Multiplexer 320 can be controlled using an IO scanchain control block. Multiplexer 320 allows for additional flexibility by providing either a clock signal or its inverse, which corresponds with a 180 degree phase shift. The output of multiplexer 320 is provided to a frequency divider circuit 325. In an embodiment, the frequency divider circuit 325 produces an output signal at half the frequency of its input signal. Thus, if a full rate clock signal is provided as input to the frequency divider circuit 325, the output 327 of the frequency divider circuit 325 will be a half rate resynchronization clock signal. An embodiment of frequency divider circuit 325 can be implemented as a counter or other state machine that changes its output on every other input cycle.

The output 327 of frequency divider circuit 325 is provided to multiplexer 330. Similar to multiplexer 320, multiplexer 330 can select between the signal at output 327 or the inverse 329 of the signal 327. The output of multiplexer 330 is provided to multiplexer 335. A third input 345 is adapted to receive a half rate resynchronization clock signal from a phase locked loop or other clock generation circuit in the programmable device core. A multiplexer 347 selects between the third input 345 or its inverse 349. The output 353 of multiplexer 347 is connected with multiplexer 335. Multiplexers used to select inverted or non-inverted signals can be controlled using an IO scanchain control block.

Multiplexer 335 selects between output 353, which in one embodiment is a half rate resynchronization clock signal provided from the programmable device core and the output of multiplexer 330, which is a half rate resynchronization clock signal generated by circuit 300. The output 340 of multiplexer 335 is provided to other circuits in the I/O block, such as one or more instances of an input circuit similar to circuit 100. For example, the output 340 of circuit 300 can be used to provide a half rate resynchronization clock signal at input 127 of circuit 100.

In summary, the output 340 of circuit 300 can be a half rate resynchronization clock signal derived from the full rate resynchronization clock signal at input 305, a half rate resynchronization clock signal derived from the full rate data strobe signal at input 310, or a half rate resynchronization clock signal generated elsewhere in the programmable device at input 345. Circuit 300 can also select between the non-inverted and inverted phases of the half-rate signals if needed. Circuit 300 has a number of different applications. By deriving the half rate resynchronization clock signal from the full rate resynchronization clock signal at input 305, there is a selectable phase relationship between the half rate and full rate resynchronization clock signals, making synchronization and timing closure easier as well as providing flexibility in circuit operation. Again, this can be selected using an IO scanchain. Alternatively, deriving the half rate resynchronization clock signal from the full rate data strobe signal at input 310 requires less programmable device resources. Using a signal at input 345 as the half rate resynchronization clock signal gives additional design flexibility.

Additionally, the circuit 300 can also provide the half rate resynchronization clock signal from the output of multiplexer 330 to programmable device resources in the programmable device core via multiplexer 354 and output 350. Multiplexer 354 can alternately provide the data strobe signal from input 310 to programmable device resources in the programmable device core via bypass path 352. Because the half rate resynchronization clock signal is used to synchronize data in the I/O block, providing this same half rate resynchronization clock signal to the programmable device core allows the registers in the programmable device core to be easily synchronized with data from the I/O block.

Embodiments of a programmable device can specify the clock signal inputs and outputs of clock generation circuit 300 statically or dynamically. In static configurations, configuration data used to specify the function of the programmable device also specifies the inputs and outputs of the clock generation circuit 300 of the I/O block. In dynamic configurations, control logic implemented in the programmable device core specifies the inputs and outputs of clock generation circuit 300 of the I/O block. In dynamic configurations, the operation of the clock generation circuit 300 of the I/O block can be changed at any time using the IO control scanchain. For example, the operation may be changed using any of the multiplexers to select any of the signals shown. Additionally the phase of the full rate clock supplied to the clock divider may be dynamically selected as well.

D. Output Enable

Figure 4:
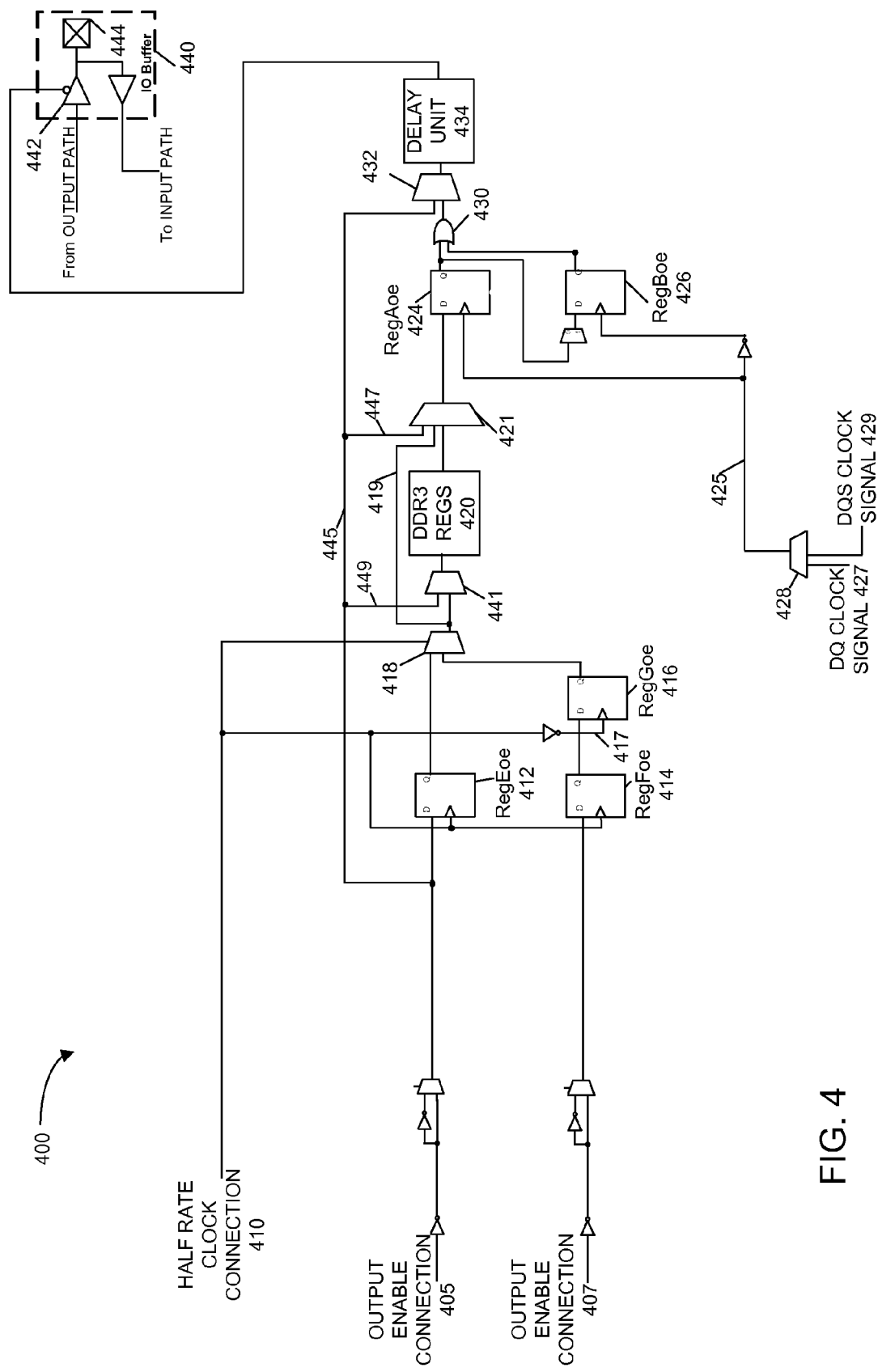
FIG. 4 illustrates an output enable signal generation circuit according to an embodiment of the invention.

As discussed above, the I/O buffer circuits 105 and 205 include buffers 109a-b and 209a-b, respectively. In an embodiment, these buffers are controlled by an output enable signal. FIG. 4 illustrates an output enable signal generation circuit 400 according to an embodiment of the invention.

Output enable circuit 400 receives a first output enable signal from the programmable device core via connection 405. In a first mode of operation of output enable circuit 400, the bypass path 445 carries the output enable signal from connection 405 through multiplexer 432 to the I/O buffer unit 440. In this mode of operation, the programmable device core generates the full rate frequency output enable signal. The full rate output enable signal from multiplexer 432 passes through delay unit 434 to I/O buffer unit 440, where it activates I/O buffer 442 to connect an output circuit, such as output circuit 200, with the I/O pin 444.

In a second mode of operation, bypass path 445 is connected from connection 405 to multiplexer 421 via path 447. In this mode, the output enable signal is a full data rate output enable signal at the full rate frequency. The output enable signal is sent from the programmable device core through multiplexer 421 to register Aoe 424, whose output is sent to register Boe 426. The full rate frequency output enable signal is then converted by register Aoe 424 (and optionally register Boe 426, if the output enable signal is a DQS data strobe signal for DDR and DDR2) into a full rate frequency output enable signal. In one aspect, the full-rate output enable signal is registered by RegAoe and optionally Boe. The result is a full-rate output-enable signal. RegBoe 426 is clocked by the negative edge of the full-rate clock. The OR gate is not mentioned. The OR gate always takes inputs from the outputs of RegAoe and RegBoe In a third mode of operation, bypass path 445 is connected from connection 405 to DDR3 registers 420 via path 449, which travels through multiplexer 441. Multiplexer 421 then selects the path from the DDR3 registers 420 to send to register Aoe 424.

In a fourth mode of operation, the programmable device core provides a second output enable signal via connection 407. Additionally, a half rate clock signal is provided to circuit 400 via connection 410. Registers Eoe 412 and Foe 414 capture the output enable signals provided by connections 405 and 407, respectively. Registers Eoe 412 and Foe 414 are clocked by the half rate clock signal received at connection 410. Register Goe 416 is clocked by the inverse 417 of the half rate clock signal received via connection 410. Register Aoe 424 is clocked by clock signal path 425. Register Goe 416 shifts the phase of the second output enable signal received at connection 407 by 180 degrees.

The outputs of registers Eoe 412 and Goe 416 are provided to multiplexer 418. Multiplexer 418 is controlled by the half rate clock signal from connection 410 and alternately selects the outputs of multiplexers Eoe 412 and Goe 416 to create a full-rate output enable signal at the full-rate frequency.

If the memory interface is a DDR3 standard memory interface, the output of multiplexer 418 is optionally provided to DDR3 registers 420 for additional processing. In the case of DDR1, DDR2, or other double data rate interfaces, the output of multiplexer 418 passes through bypass path 419 and multiplexer 421 unchanged.

When the output enable circuit 400 generates an output enable signal for a DQ data signal, a DQ clock signal 427 is connected with clock signal path 425 via multiplexer 428. In this configuration, register Aoe 424 is clocked by the DQ clock signal 427 which synchronizes the full-rate signal output by multiplexer 421 onto a full rate clock which can be generated by any means described herein. The full rate output enable signal from register Aoe 424 passes through OR gate 430, multiplexer 432, and delay unit 434 to I/O buffer unit 440, where it activates I/O buffer 442 to connect an output circuit, such as output circuit 200, with the I/O pin 444. For DQ output enables the input to Register Boe 426, clocked by the inverse of DQ clock signal 427, will be set to a programmably static value by the MUX before register Boe 426, thus allowing only the signal from register Aoe 424 to be transmitted to multiplexer 432. For DDR, DDR2, RLII, etc data OE clock 427 can be provided from the core. For DDR3 clock 227 is provided from a selected tap of the write leveling delay chain.

When the output enable circuit 400 generates an output enable signal for a DQS data strobe signal, a DQS clock signal 429 is connected with clock signal path 425 via multiplexer 428. In one embodiment, e.g. for DDR3, DQS clock signal 429 is generated using a write leveling delay chain. In other embodiments, other memories use a DQS clock signal generated in the core.

In this configuration, register Aoe 424 is clocked by the DQS clock signal 429 and register Boe 426 is clocked by the inverse of the DQS clock signal 429. Register Aoe 424 is used for DQS and DQ generation. In one embodiment, when interfacing with DDR3, only register Aoe 424 is used for DQS generation. Register Aoe 424 generates the DQS preamble aligned with the rising edge of the DQS clock. For DDR2, a half-period DQS preamble is required, which is aligned with the falling edge of the DQS clock. This is achieved by registering the full-rate signal using register Aoe 424. The output of register Aoe 424 is then registered by register Boe 426 on the negative edge of the clock. The full rate output enable signal from registers Aoe 424 and Boe 426 pass through OR gate 430, multiplexer 432, and delay unit 434 to I/O buffer unit 440, where it activates I/O buffer 442 to connect an output circuit, such as output circuit 200, with the I/O pin 444.

Output enable circuit 400 can thus be configured to generate output enable signals suitable for DQ data signals or DQS data strobe signals, depending upon the desired function of I/O pin 444. Also, output enable circuit 400 can receive three different types of inputs from the programmable device core and can generate two different types of output enable signals. The output enable circuit 400 can receive two output enable signals at the half rate frequency or a full rate output enable signal from the programmable device core. The output enable circuit 400 can generate an output enable signal for a DQ data signal or a DQS data strobe signal.

II. DDR3

For DDR and DDR2 memory interfaces, the memory clock and address/command signals have been launched from the memory interface at the same time and these signals arrive at the attached DDR or DDR2 memory devices at the same time. This means that the write data (DQ) for a DDR or DDR2 memory interface can also be launched at the same time for a write command. Similarly, this means that when a read command is issued to DDR or DDR2 memory devices the requested read data (DQ) is launched from the attached memory devices at the same time and arrives at the FPGA memory interface at the same time.

Figure 5:
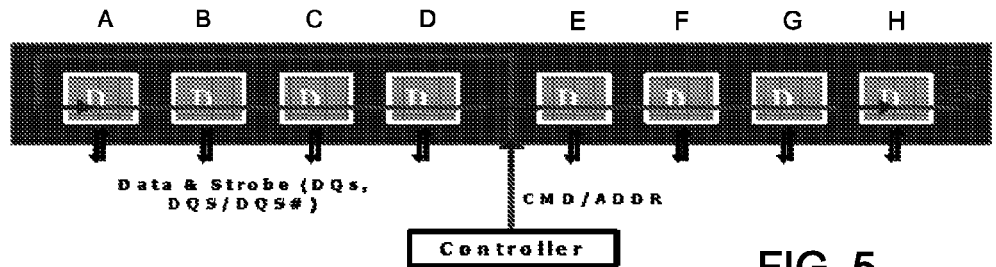
FIG. 5 illustrates an exemplary DDR3 clocking and address/command topology.

FIG. 5 illustrates an exemplary DDR3 clocking and address/command topology. For DDR3 memory topologies, e.g. the DIMM seen in FIG. 5, the memory clock and address/command does not fan out to all attached DDR3 memory devices A-H with the same propagation delay. Instead, a fly-by signal routing scheme is used for the clock and address/command signals. Referring to FIG. 5, the memory clock and address/command (cmd/addr) signals launched from the DDR3 memory controller arrive at DDR3 device A 1st, DDR3 device B 2nd and so on until the clock and address/command arrive at the final DDR3 device, H.

As a result when a write command is issued by the DDR3 memory controller, this command is decoded by the DDR3 memories at different times. This means that unlike traditional DDR and DDR2 memory controllers, the write data (DQ), write strobes (DQS and DQS_n), and data mask signals (DM) for each attached DDR3 memory device need to be launched from the memory controller at different times, where DQS_n is the inverse of DQS. Note that DDR2 at certain frequencies requires differential DQS whereas DDR3 always requires differential DQS. In order for the write data (DQ) to be correctly registered into the DDR3 memory device, a specific DDR3 timing parameter, tDQSS, needs to be met and maintained. The timing parameter tDQSS is the DQS/DQS_n timing relationship with respect to the associated memory clock edge seen at the memory device. This tDQSS timing relationship is dynamically setup using a process known as write margining.

Figure 6:
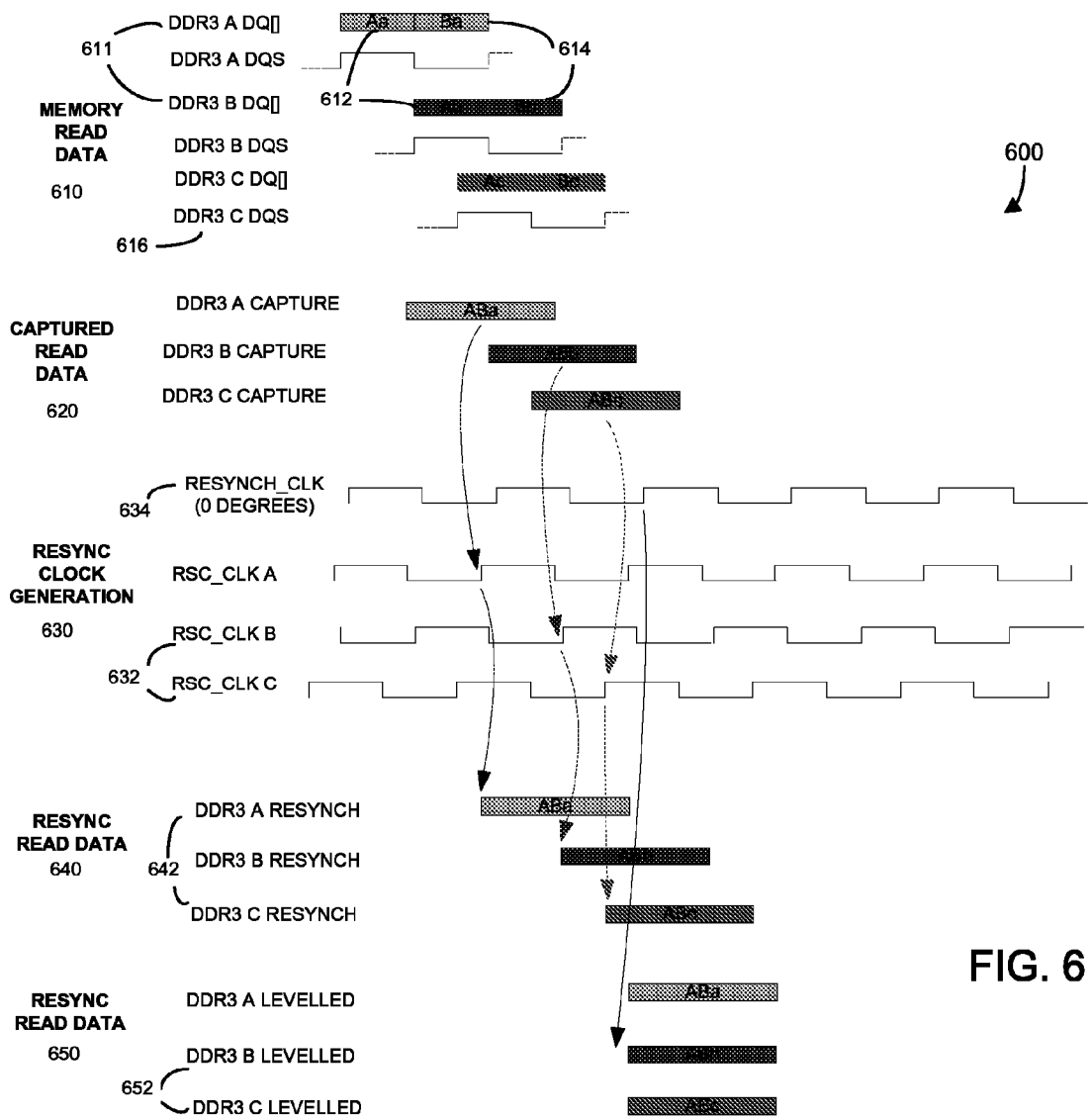
FIG. 6 illustrates a method of read leveling data signals received by a memory interface from a DDR3 memory according to an embodiment of the present invention.

The same holds true for DDR3 read commands. Each attached DDR3 memory device decodes the read request at a different time due to the fly-by clocking and address/command routing topology. The result is that the read data (DQ) and associated read strobes (DQS and DQS_n) are launched from each DDR3 memory device at a different time. The resultant read data for each attached DDR3 memory device arrives at the memory controller interface at a different time, as shown in FIG. 6 for signals DDR3 A DQ[ ], DDR3 B DQ[ ] and DDR3 C DQ[ ]. There can be more or fewer DQ groups used than described in this example Accordingly, some embodiments of the present invention provide an I/O block configured to handle the staggered write data (DQ), data mask (DM) and write strobe (DQS and DQS_n) generation as well as a scheme for capturing, resynchronizing, leveling and converting the staggered read data (DQ) into a half-rate data when interfacing to DDR3 memory devices. In one embodiment, logic is used to setup and maintain the tDQSS timing parameter via a dynamic write margining scheme. In another embodiment, logic is used to resynchronize captured data from multiple memory device using multiple clocks. In yet another embodiment, the I/O block is configured to allow the DDR3 memory interface to run at higher frequencies when interfacing with DDR3 memory devices because all the logic required for the DDR3 scheme is contained within the 10 block. Also, because the I/O block is dynamically controllable, the DDR3 DIMMs with different memory device ordering can be inserted without having to recompile the memory interface.

In one embodiment, the number of registers required in the FPGA core to implement a half-rate DDR3 write datapath is minimized. In one aspect, when writing to DDR3 memory devices the write data is launched at different times per DQS group from the memory interface.

A. Read Leveling

FIG. 6 illustrates a method 600 of read leveling data signals received by a memory interface from a DDR3 memory according to an embodiment of the present invention. The read data flow is shown for three attached DDR3 memory devices A, B and C. The horizontal axis is time. In stage 610, the memory read data is received at input pins. The double data rate DQ data 611 for different memory devices is shown for bits A 612 and B 614. The DQS signal 616 is also shown. For ease of presentation, it is assumed that all of the DQ signals 611 for a single device arrive at the same time, but DQ and DQS signals from different devices arrive at different times. As shown, bit Aa from device A and bit Ab form device B do not overlap, which causes problems for synchronizing. Bits Ab and Ac do overlap, but in reality, it must be assumed that there is no overlap between the captured read data for the individual DDR3 memory devices.

In stage 620, the data is captured. As shown, once the read data (DQ) for each DDR3 device has been captured by the read strobes 616 (DQS and DQS_n), the captured read data is staggered due to the fly-by clocking, address and command topology. The captured read data is shown as DDR3 A CAPTURE, DDR3 B CAPTURE and DDR3 C CAPTURE. Due to the fact that there may be no overlap between the captured read data for the individual DDR3 memory devices, unlike DDR and DDR2 memory controllers, a single resynchronization clock cannot be used to resynchronize the captured read data onto a free-running clock domain. Instead, embodiments of the present invention use an individual resynchronization clock for each attached DDR3 memory device.

In stage 630, resynchronization clocks 632 are created for each device. In one embodiment, the resynchronization clocks 632 are each created with a specified phase from a zero phase resynchronization clock 634. Stage 640 shows the resynchronized data 642.

In stage 650, the resynchronized data 642 is leveled so that the resulting data 652 is synchronized with the zero phase resynchronization clock 634. Note that the term leveling may be applied to stages 650, and likewise with the terms resynchronization or synchronization.

Figure 7:
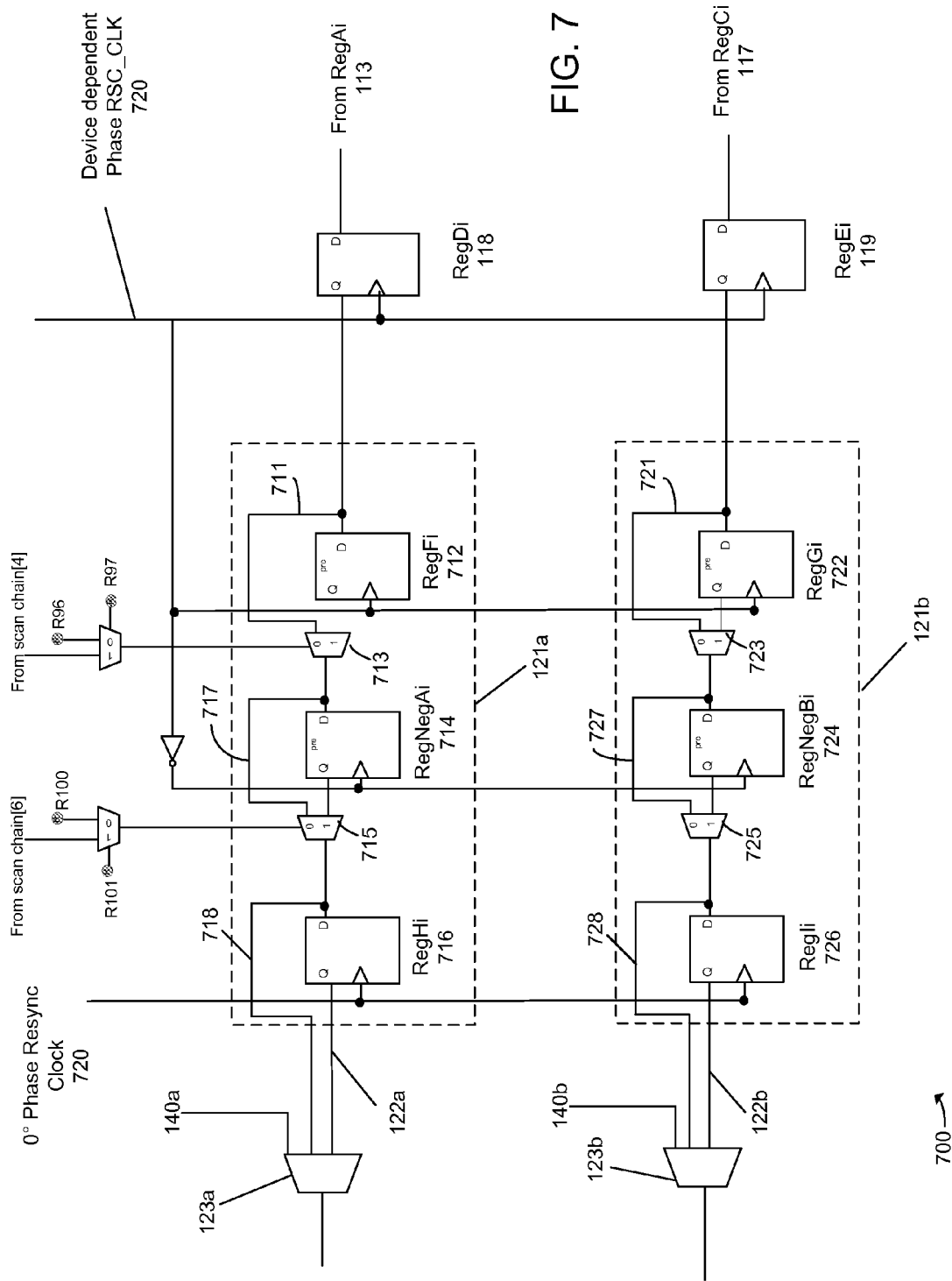
FIG. 7 illustrates a circuit containing registers for read leveling DDR3 input data according to an embodiment of the present invention.

FIG. 7 illustrates a circuit 700 containing registers for read leveling DDR3 input data according to an embodiment of the present invention. The read data (DQ) for each attached DDR3 memory device has been captured by the delayed read strobe (DQS) at registers RegAi 113, RegBi 114 and RegCi 117 as shown in FIG. 1. As shown in FIG. 6, the captured read data is staggered and thus there is need for resynchronization. The captured read data is then transferred to registers RegDi 118 and RegEi 119, respectively, where the data is clocked off a free-running clock, which may be from a phase-locked loop (PLL) in the core.

In one embodiment, RegDi 118 and RegEi 119 are clocked by a resynchronization clock that is dependent on which memory device the data is being received from. In one aspect, the phases of the separate resynchronization clocks are selected using a read leveling scheme as describe above and in concurrently filed and commonly owned U.S. patent application "read-leveling implementations for DDR3 applications on an FPGA," which is referenced above. In one embodiment, the resynchronization clock phases are generated using a read leveling delay chain which is a delay chain made up of N (e.g. 7) delays which provides N+1 selectable clock phases.

Figure 8:
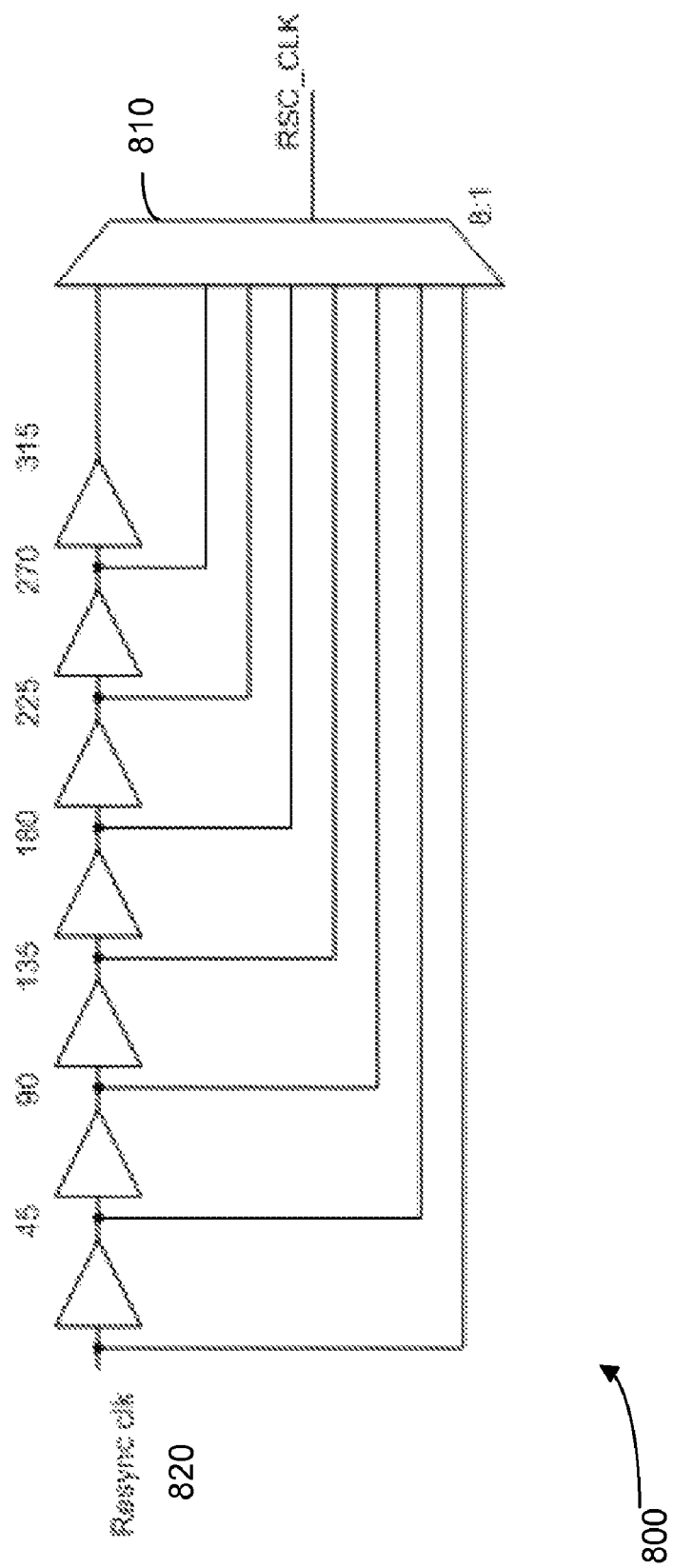
FIG. 8 illustrates a read leveling delay chain according to an embodiment of the present invention.

FIG. 8 illustrates a read leveling delay chain 800 according to an embodiment of the present invention. A (8:1) multiplexer 810 is used to select one of the 8 phases for each required resynchronization clock. In FIG. 8, there could be more than or less than 8 available clock phases to select for the resynchronization clock. In one embodiment, there is one multiplexer per DQS group (DDR3 memory device). This allows the read leveling logic to generate a different resynchronization clock for each attached DDR3 memory device, for example 8 DDR3 memory devices could require 8 different resynchronization clock phases. A DDR3 DQS group is a group of data pins (DQ) that can be captured using DQS/DQS_n differential strobes from a DDR3 memory device. The phase of the resynchronization clock per DQS group can be dynamically selected by the IP in the FPGA core using a dedicated I/O block control scanchain. In one embodiment, the read leveling delay chain is controlled by a delay-locked loop (DLL) which is responsible for maintaining the delay in the read leveling delay chain across process, voltage and temperature (P, V and T).

In one embodiment, the resync_clk 820 input to the read leveling delay chain is the 0 degree reference resynchronization clock that is sourced from a PLL in the FPGA core. The clock frequency of this PLL clock may be the same frequency as the attached DDR3 memory devices. The selected resynchronization clock from the read leveling delay chain that is sent to each DQS group is shown as RSC_CLK. In circuit 700, the resynchronization registers RegDi 118 and RegEi 119 are clocked by the free-running phase offset resynchronization clock, RSC_CLK, selected on a DQS group basis. The resynchronization process can be seen in FIG. 6 where the resynchronization clocks RSC_CLK A, RSC_CLK B and RSC_CLK C are used to resynchronize the offset captured data DDR3 A CAPTURE, DDR3 B CAPTURE and DDR3 C CAPTURE generating the resynchronized data DDR3 A RESYNCH, DDR3 B RESYNCH and DDR C RESYNCH. It can be seen that once the data is resynchronized that it is still offset.

From RegDi 118 and RegEi 119, the data can be transferred to DDR3 registers 121a and 121b, respectively. In one embodiment, the DDR3 registers are used as the DDR3 registers of FIG. 1. DDR3 registers 121a include registers RegFi 712, RegNegAi 714, and RegHi 716. DDR3 registers 121b include registers RegGi 722, RegNegBi 724, and Regli 726.

In one embodiment, the resynchronized read data is registered by another set of registers, RegFi 712 and RegGi 722, that can be dynamically switched in or out by the IP in the FPGA core using the I/O block scanchain, e.g. using multiplexers 713 and 723. These registers are clocked off the full-rate resynchronization clock, RSC_CLK, that is selected on a DQS group basis from the read leveling delay chain.

When the read data arrives at the memory controller interface it is possible that the arrival times of the read data (DQ) and read strobes (DQS and DQS_n) between different DDR3 memory devices could be in different full-rate clock cycles. Registers RegFi 712 and RegGi 722 are known as read 1T registers and can be dynamically switched in or out to insert a full-rate clock cycle of delay (1T) and are used to align the resynchronized data between DQS groups to be within the same full-rate clock cycle. The read 1T registers can be dynamically switched in or out on a DQS group basis using the I/O block scanchain, using bypass paths 711 and 721. The requirement for the 1T registers may be determined during a DDR3 auto-calibration process.

In an embodiment, before the resynchronized read data is converted into half-rate data as may be done according to input circuit 100, the data needs is leveled onto a single clock domain. In the DDR3 scheme this leveling process is done by registering the resynchronized read data onto the reference 0 degree resynchronization clock phase 720. Depending on the phase of the selected resynchronization clock, RSC_CLK, per DQS group there is the potential for timing violations when transferring the data from the RSC_CLK clock domain to the 0 degree reference resynchronization clock domain. To avoid this, negative edge registers, RegNegAi 714 and RegNegBi 724, can be dynamically switched in or out on a DQS group basis using the I/O block scanchain, e.g. using multiplexers 715 and 725, and respective bypass paths 717 and 727. In one embodiment, RegNegAi 714 and RegNegBi 724 are clocked off the negative edge of the selected resynchronization clock per DQS group, RSC_CLK.

Once the captured read data has been resynchronized onto the correct reynschronization clock per DQS group, the 1T read registers have been switched in or out and the negative edge timing registers have been switched in or out, the read data for all DQS groups is transferred to a single clock domain. As mentioned previously this clock is the 0 degree reference resynchronization clock 720, which is used to clock registers RegHi 716 and Regli 726. This is shown in FIG. 6 as the leveled read data, DDR3 A LEVELLED, DDR3 B LEVELLED and DDR3 C LEVELLED. In one embodiment, RegHi 716 and Regli 726 can be dynamically switched in or out on a DQS group basis or for all groups by choosing the bypass paths 718 and 728, respectively. In one aspect, the bypass paths within DDR3 registers 121a and 122b when taken together are equivalent to the bypass paths 140a and 140b or may be used in place of them.

In one aspect, because the resynchronization registers, 1T registers, negative edge registers and leveling registers are now in the I/O block, the interconnect routing delay between the various register stages is kept to a minimum. The overall effect is that these paths' PVT component accounted for in the overall timing budget is reduced, thus allowing the read datapath to run at higher frequencies. Additionally, no timing constraints are required because the timing path in the I/O block is guaranteed by design.

B. Write Leveling

Figure 9:
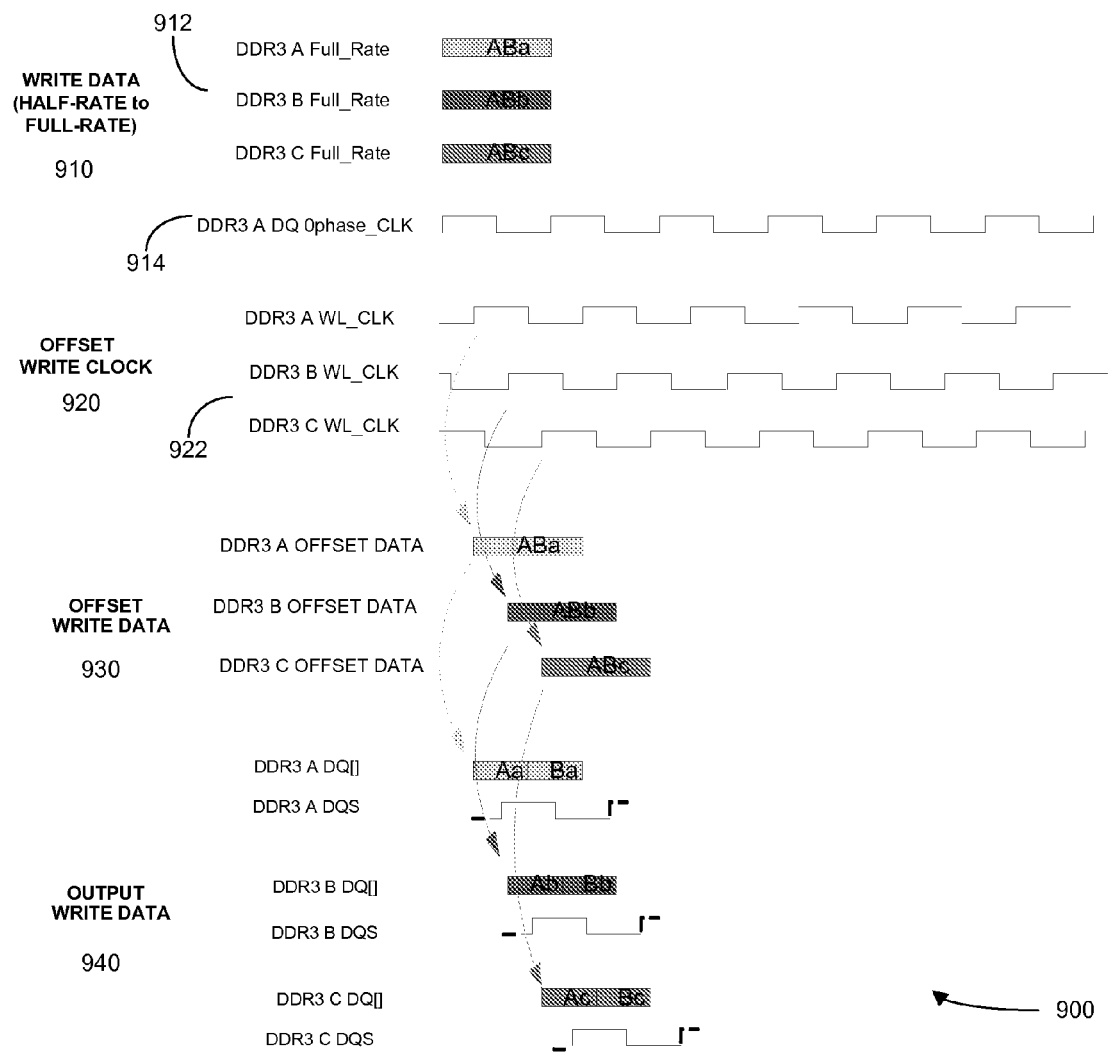
FIG. 9 illustrates a method of write leveling data signals to be transmitted by a memory interface to DDR3 memory devices according to an embodiment of the present invention.

FIG. 9 illustrates a method 900 of write leveling data signals to be transmitted by a memory interface to DDR3 memory devices according to an embodiment of the present invention. The write data flow is shown for three attached DDR3 memory devices A, B and C. The horizontal axis is time. In stage 910, the write data is received as full-rate data at a full-rate clock frequency, such as from the half-rate output registers of circuit 200. At this point, the data 912 is synchronized with a zero phase clock 914 (DQ 0phase_CLK), which may be sourced from a PLL in the FPGA core, which can be a different PLL than the one used for read leveling. Thus, in one aspect, the read and write leveling delay chains are separate. Additionally, the system can be configured to use individual or shared write leveling delay chains. In shared mode, both the DQ and DQS clocks are generated from the same write leveling delay chain. In individual mode, the DQ and DQS clocks are generated using the separate chains. This is further discussed in FIG. 11

In stage 920, a write leveling (WL) clock 922 for each memory device is generated. In one embodiment, the WL clocks 922 are each created with a specified phase from zero phase clock 914. In stage 930, the data is offset and synchronized with WL clocks 922. As one can see, the leading edge of each data is now aligned with a leading edge of the corresponding WL clock. In stage 940, the data is output along with the corresponding write strobe signal. In one embodiment, the DQS signals are shifted by 90 degrees from the DQ signals.

The same method 900 can also be applied to the DQS and DQS_n write strobe generation, but this is not explicitly described because the principle is the same to the write data except that the clocks used are different. In a similar fashion the output enable (OE) path is not fully described because it is very similar to the write datapath.

Figure 10:
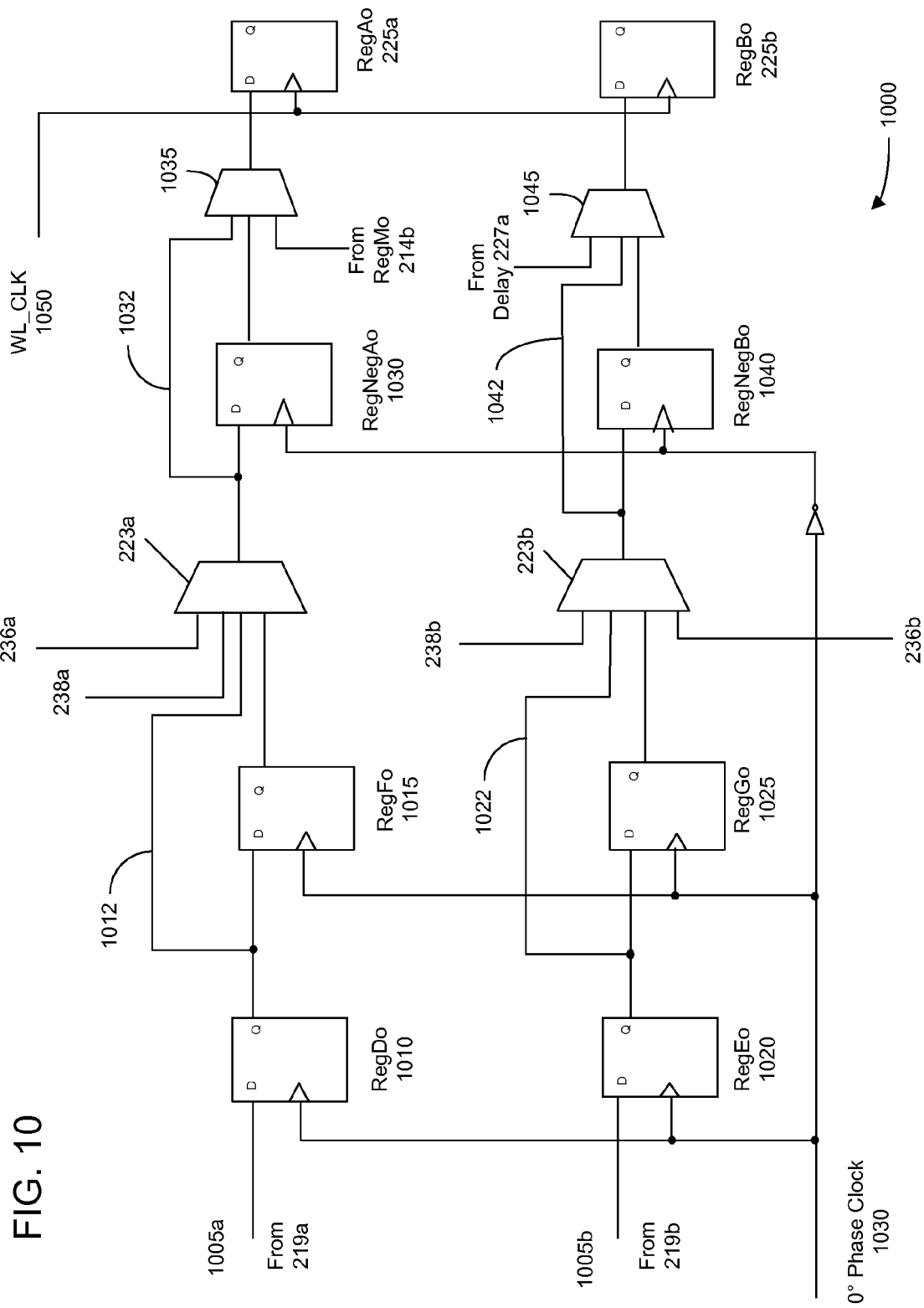
FIG. 10 illustrates a circuit containing registers for write leveling DDR3 output data according to an embodiment of the present invention.

FIG. 10 illustrates a circuit 1000 containing registers for write leveling DDR3 output data according to an embodiment of the present invention. In one embodiment, the inputs 1005a and 1005b are received from outputs of multiplexers 219a and 219b of circuit 200, respectively. Thus, registers RegDo 1010 and RegFo 1015 may be part of the DDR3 registers 221a, and registers RegEo 1020 and RegGo 1025 may be part of the DDR3 registers 221b. Accordingly, in embodiments where DDR3 support is needed either the bypass 240a and 240b for full cycle data form the core or full cycle data received from the half-rate registers of circuit 200 may be inserted in circuit 1000. In one embodiment, the write data from multiplexers 219a and 219b is registered by registers RegDo and RegEo on zero phase clock 1030, which is zero phase clock 914

Once the write data has been transferred to the write leveling delay chain reference clock, zero phase clock 914, the destination of this registered data can by dynamically controlled depending on the delays between the different DDR3 memory devices and the output write clock phase. In a similar fashion to the read datapath there is a set of 1T registers (RegFo 1015 and RegGo 1025) per DQS group that can be dynamically switched in or out using, for example, the I/O scanchain controlled by the IP in the FPGA core. In one embodiment, multiplexers 223*a* and 223*b* are used to select bypass paths 1012 and 1022 respectively if the 1T registers are to be switched out.

In one embodiment, the write 1T registers exist in the write data (DQ), output enable(OE) and write strobe (DQS and DQS_n paths). The write 1T registers are used to insert a full-rate clock cycle if the required write data (DQ) for a DDR3 memory needs to be output from the memory interface in different full-rate clock cycles. The write 1T registers are clocked off the zero phase clock 1030. The 1T registers per DQS group can be optionally inserted using the IO scanchain control block There is another set of registers that can be dynamically inserted, for example, using the I/O scanchain controlled by the IP in the FPGA core. These are shown as RegNegAo 1030 and RegNegBo 1040. In one aspect, multiplexers 1035 and 1045 are used to dynamically select bypass paths 1032 and 1042 respectively for switching out registers RegNegAo 1030 and RegNegBo 1040. These registers are clocked off the negative edge of the write 0 phase clock 1030. If the setup of the DDR3 memory interface selects a write data output clock phase that is too close to the write reference clock phase, then the DDR3 memory controller can switch in these negative edge registers to guarantee safe data transfer. The negative edge registers are optionally inserted using the IO scanchain control block A next stage of the DDR3 write data path is the output registers RegAo 225*a* and RegBo 225*b* that are used to generate the double-date rate write data used during DDR3 write transaction. The clock used to clock these output registers is sourced from a write leveling delay chain and is shown as WL_CLK 1050. WL_CLK 1050 can be selected on a DQS group basis, for example if there are 8 attached DDR3 memory devices then the write leveling delay chain can generate 8 different write data output clock phases. FIG. 9. illustrates the offset full-rate write data, DDR 3 A OFFSET DATA, DDR 3 B OFFSET DATA and DDR 3 C OFFSET DATA. FIG. 9 also illustrates the offset double data-rate output write data, DDR3 A DQ[ ], DDR3 B DQ[ ] and DDR3 C DQ[ ]. The offset related write data strobes are shown as well, DDR3 A DQS, DDR3 B DQS and DDR3 C DQS, which may be offset by 90 degrees with respect to the write data DQ[ ].

Figure 11:
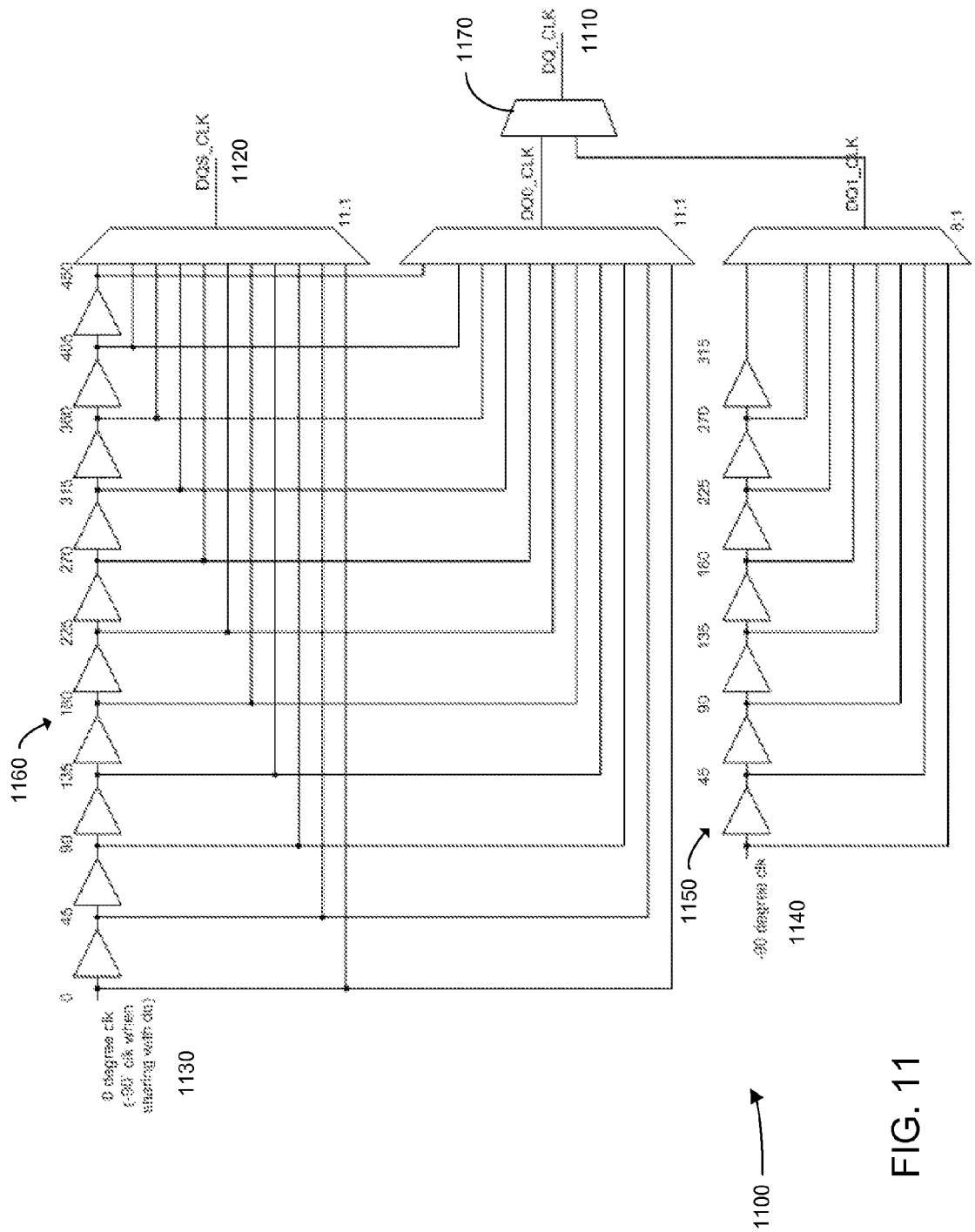
FIG. 11 shows a write leveling delay chain according to an embodiment of the present invention

FIG. 11 shows a write leveling delay chain 1100 according to an embodiment of the present invention. In one embodiment, if the I/O pin is configured for write data (DQ) generation, the selected clock (WL_CLK) is taken from DQ_CLK 1110. In another embodiment, if the I/O pin is configured for the write strobe generation (DQS and DQS_n), the selected clock (WL_CLK) is taken from DQS_CLK 1120. In one aspect, the write leveling delay chain is very similar to the read leveling delay chain in that it is used to generate multiple clock phases which are PVT compensated using a DLL and are used to generate the double data rate write data (DQ), data mask (DM), output enable and write strobes (DQS and DQS_N). The write data on the 0phase_CLK is shown in FIG. 9 as DDR3 A FULL_RATE, DDR B FULL_RATE and DDR3 C FULL_RATE.

In individual write leveling delay chain mode, DQ_0phase_CLK is the −90 degree clk 1140, and DQS_0phase_CLK is the 0 degree clk 1130. In one embodiment, both 0 degree clk (DQS_0phase_CLK) and −90 degree clk (DQ_0phase_CLK) clocks are sourced from PLL outputs in the FPGA core. In one embodiment, when configured for individual write leveling delay chains, there is a delay chain 1150 that generates the clocks for the write data (DQ) and another delay chain 1160 that generates the clocks for the write strobes(DQS and DQS_n). Note that DQ_0phase_CLK corresponds to signal 914.

In one embodiment, when configured for shared write leveling delay chain mode, one PVT compensated delay chain 1160 is used to locally generate for example 11 clock phases (10 delay taps), where 8 clock phases are evenly spread across one full-rate clock cycle, for the write strobe (DQS and DQS_n) clock and the write data (DQ) clock, as shown in FIG. 11. Delay chain 1160 can have more or fewer than 11 available separate clock phases.

In one embodiment, in shared write leveling delay chain mode, the DQS and DQ 0 phase clocks need to have a 90 degree phase relationship. One or more multiplexers may be used to select the appropriate taps of the shared leveling delay chain 1160 or the input clock 1130 to the write leveling delay 1160 chain to generate the DQ and DQS 0 phase clocks. For example in the 10 delay tap delay chain described above, 8 of the 11 available clock phases are spread evenly across a full-rate clock period. This means that each delay tap is equivalent to 45 degrees of phase delay. For example, to generate a 90 degree phase offset between DQ and DQS 0 phase clocks the following clock selections need to be made: for DQS_0PHASE_CLK select write leveling delay chain 1160 tap 2 and for DQ_0PHASE_CLK (signal 914) select write leveling delay chain 1160 input signal 1130. Depending on the frequency of operation other phase offsets between the DQS and DQ 0 phase clocks can be selected.

In an embodiment, when both DQS and DQ output clocks are shared from the same chain, write data −90 degree clock is used as the input to delay chain 1160. The 11 clock phase (10 tap) delay chain 1160 gives the flexibility to use a DQS clock which is naturally 90 degree shifted from DQ clock. The other self-compensated delay chain 1150 is used to locally generate, for example, 8 clock phases (8 clock phases evenly across one clock cycle) for DQ clock. In FIG. 9. the DDR3 A WL_CLK, DDR3 B WL_CLK and DDR3 C WL_CLK clocks are selected by multiplexer 1170 which taps all the 11 possible outputs when the write leveling delay chains are shared (8 in case of the separate write leveling delay chain configuration). The 8 clock phase (7 tap) delay chain 1150 has phases from 0 degrees to 315 degrees, unlike the 10 tap 1160 delay chain which has all phases from 0 degrees through 450 degrees. In one embodiment, the delay settings of the delay chains 1150, 1160 are controlled by a DLL which is used to compensate for PVT variations at the leveling delay chain, i.e. the leveling delay chain delay is maintained over P, V and T.

The offset write clocks for the write data (DQ), output enables and write strobes(DQS and DQS_n) can be generated as previously mentioned by the write leveling delay chain or chains. The write data, output enable and write strobe clocks can be generated using one of the following write leveling delay chain options; a shared write leveling delay chain that generates the clocks required for the write data (DQ), output enable and write strobes (DQS and DQS_n) or individual write leveling delay chains.

As described above, the DDR3 memory clocks can be generated using a clock sourced from a write leveling delay chain or chains. This means that the generated write data (DQ), data mask (DM), write data strobes (DQS and DQS_N) and memory clocks are all generated using PVT compensated clocks from the write leveling delay chain or chains. Accordingly, these outputs all experience the same PVT compensation effects due to the DLL. Thus, the tight timing relationship between these signals is maintained as PVT varies resulting in a higher operating frequency.

A result of embodiments of the present invention is that the complexity of logic and clocking required to interface to DDR3 memory devices is contained all within the I/O structure. This has the advantage that fewer clocking and register resources are required in the FPGA core. Because all of the registers are in the I/O structure, any routing interconnects delays are minimized leading to smaller PVT variations. An effect is that the timing budget reduction due to PVT variations is reduced, which means that the DDR3 memory interface can operate at higher frequencies. In one aspect, the use of PVT compensated leveling delay chains to generate the required clocks ensures that a tight timing relationship is maintained between all signals on these clock domains. A result again is a DDR3 memory interface that is capable of running at high frequencies. The half-rate data transfer between the FPGA core-I/O block and the I/O block-FPGA core also ensures that the DDR3 memory interface can operate at as high a frequency as possible because there are no timing paths between the I/O block and the FPGA core that are going to cause timing closure problems. The half-rate I/O block connection also makes timing closure significantly easier for the FPGA compilation software as the frequency of the DDR3 memory interface increases.

In one embodiment, logic provides the ability to dynamically select the input signal from the input pin without having to go through any of the registered stages, as shown in FIG. 1 by full bypass path 145. In effect this is a combinatorial input path. The selection of the registered input path (capture, resynchronization, leveling and half-rate) or the purely combinatorial path can be dynamically controlled using the I/O scanchain that is controlled from IP in the FPGA core. This combinatorial input path can be used during the write leveling process of the DDR3 auto-calibration algorithm when used to select the correct DQS clock phase from the write leveling delay chain on a DQS group basis. In one aspect, this ensures that the tDQSS DDR3 timing parameter is satisfied at auto-calibration time and is maintained for all time there after using a PVT compensated clock from the write leveling delay chain or chains. Note that the MUXes that select the taps of delay chains 1160 and 1150 can be configured statically or can dynamically controlled using the 10 scanchain control block III. QDR and RLDRAM During a RLDRAM read operation, the read data (Q) is captured by the delayed read strobe (DQS) at registers RegAi 113, RegBi 114 and RegCi 117 as shown in FIG. 1. In one embodiment, the captured read data (Q) is resynchoronised and converted to half-rate data as described above. During a QDR read operation, the read data (Q) is captured by the delayed read strobe (DQS) at registers RegAi 113 and RegCi 117 and by the delayed read strobe (/DQS) at register RegBi 114 as shown in FIG. 1. In one embodiment, the captured read data (Q) is resynchoronised and converted to half-rate data as described above. The continuous read strobe of QDR and RLDRAM based memory devices can benefit the resynchronization and half-rate conversion in a single stage, thus reducing the read latency through the I/O block. As described in more detail later, a delayed DQS strobe can be divided by 2 in the I/O block by the dedicated clock divider circuit 325 of FIG. 3, and the resulting clock can be used to clock the half-rate read registers.

In one embodiment, I/O block half-rate registers can be clocked by a divided clock generated by a clock sourced from DQS 115 or /DQS 116. In another embodiment, this clock may be input to the I/O block as the half rate resynchronization clock 127 of circuit 100. The number of clocks required for the half-rate memory controller read datapath can be reduced by taking advantage of the dedicated clock divider circuit 325 in the I/O block as seen in FIG. 3. In one aspect, using a delayed DQS clock input means that no dedicated FPGA core PLL resources are required in the FPGA to clock any resynchronization or half-rate registers in the I/O block.

The clock signal 350 can be used by any registers in the FPGA core. This creates a source synchronous data and clock transfer from the I/O block to the FPGA core, which results in easier timing closure on these I/O block to FPGA core paths. A net result is a higher operating frequency. Another benefit of this scheme is that because the timing closure in now greatly eased, the half-rate clock generated in the I/O block can be routed on normal routing instead of dedicated clocking resources. This ensures that the dedicated clocking resources are not wasted. In one embodiment, the phase of the divided delayed DQS clock can be dynamically inverted using the I/O block scanchain.

In one embodiment, in dividing down the delayed DQS clock from the attached QDR or RLDRAM memory device, the logic complexity in the memory controller is greatly reduced because the capture register to half-rate register timings are guaranteed by design. In one aspect, the only control required is the determination of the half-rate clock phase. If at FPGA power-up time the memory controller issues a read to the attached QDR or RLDRAM or variant memory device and the read returns incorrect data, the control logic uses the I/O scanchain to invert the phase of the divided down delayed DQS clock. This will result in the correct phase of the divided clock being setup with no further control required. In one embodiment, the memory controller first writes a known training pattern to the attached memory for setting up the correct phase.

IV. PLD

Figure 12:
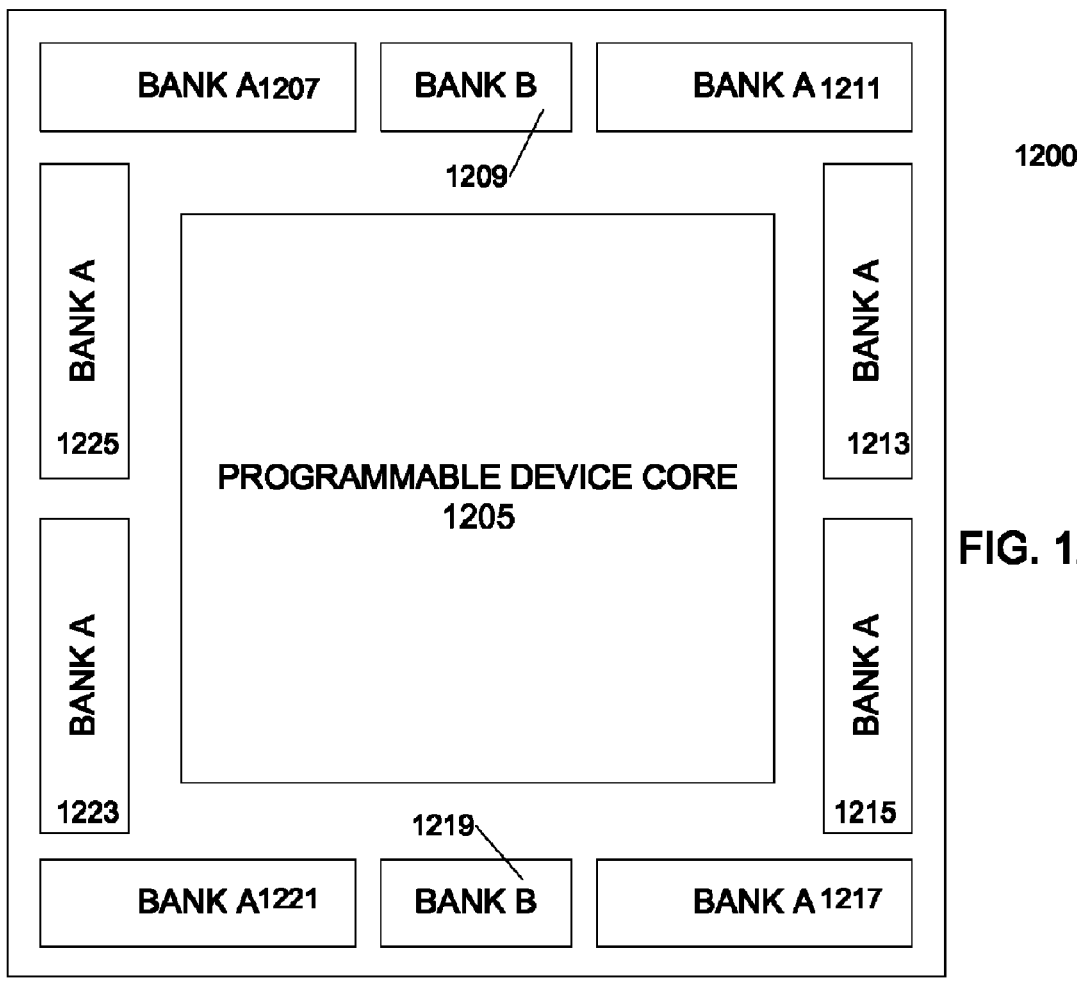
FIG. 12 illustrates a programmable device and I/O bank architecture according to an embodiment of the invention.

FIG. 12 illustrates a programmable device and I/O bank architecture 1200 according to an embodiment of the invention. Device architecture 1200 includes a programmable device core 1205. Programmable device core 1205 includes programmable device components such as logic cells, functional blocks, memory units, and a configurable switching circuit.

Device architecture 1200 includes a plurality of I/O banks, such as I/O banks 1207, 1209, 1211, 1213, 1215, 1217, 1219, 1221, 1223, and 1225. In an embodiment, device architecture 1200 allows for any number of I/O banks.

In an embodiment, the plurality of I/O banks belong to a limited number of I/O bank types. For example, I/O banks 1207, 1211, 1213, 1215, 1217, 1221, 1223, and 1225 are of I/O bank type A. I/O banks 1209 and 1219 belong to I/O bank type B. Each I/O bank type specifies the number of I/O pins and other attributes for its member I/O banks. For example, type A I/O banks may have 60 I/O pins and type B I/O banks may have 36 I/O pins. The number of I/O banks types is not limited to two types, and many common implementations of device architecture 1200 may include four or more different I/O types.

In an embodiment, all or a large portion of the I/O pins of an I/O block are each associated with an instance of input circuit 100, output circuit 200, and output enable circuit 600. In this embodiment, each I/O pin can operate as a data or data strobe input, a data output, or a data strobe output.

Figure 13:
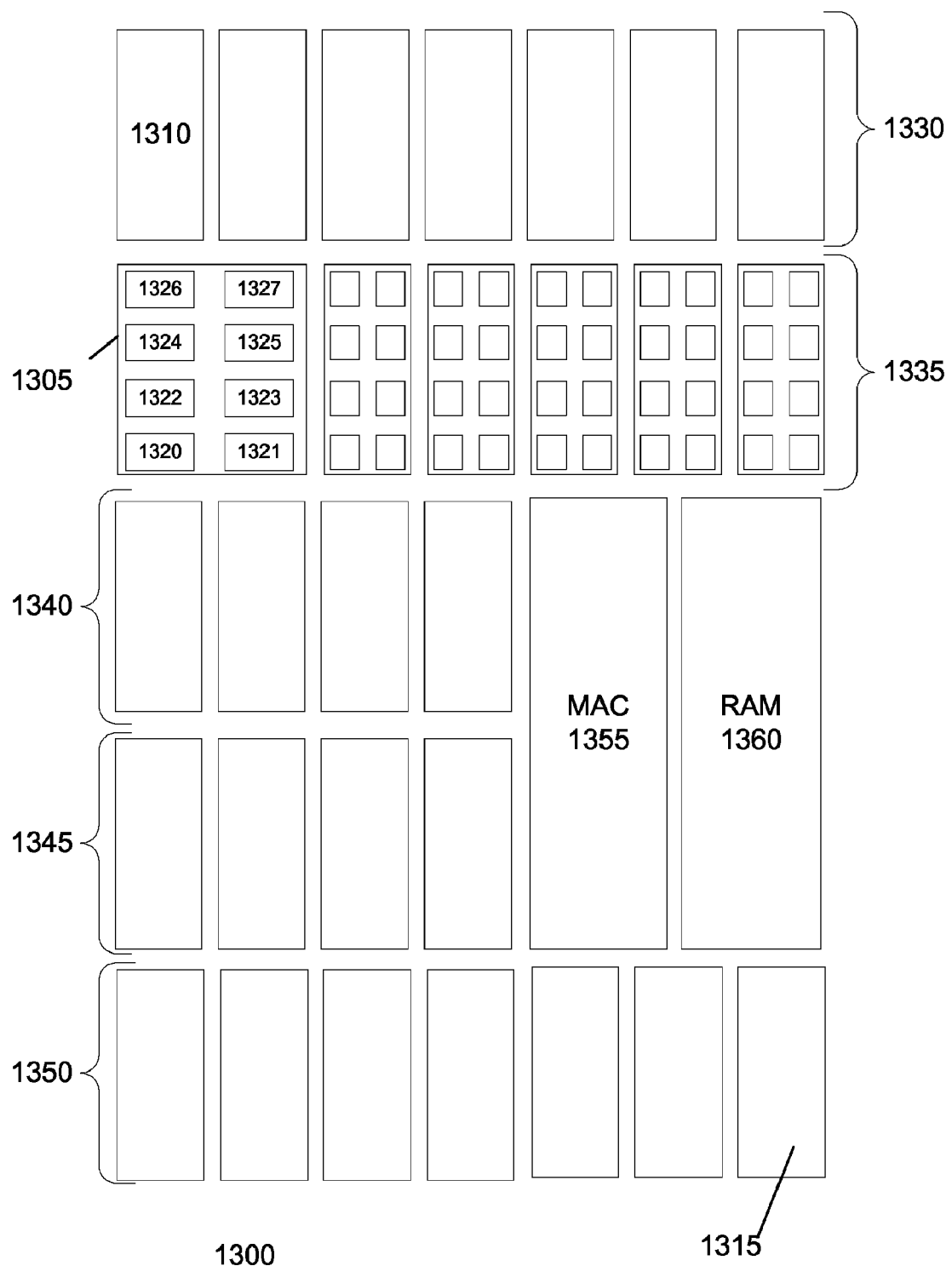
FIG. 13 illustrates a programmable device suitable for use with an embodiment of the invention.

FIG. 13 illustrates a programmable device 1300 suitable for use with an embodiment of the invention. Programmable device 1300 includes a number of logic array blocks (LABs), such as LABs 13013, 1310, 1315. Each LAB includes a number of programmable logic cells using logic gates and/or look-up tables to perform logic operations, as well as registers to store and retrieve data. LAB 1305 illustrates in detail logic cells 1320, 1321, 1322, 1323, 1324, 1325, 1326, and 1327. Logic cells are omitted from other LABs in FIG. 13 for clarity. The LABs of device 1300 are arranged into rows 1330, 1335, 1340, 1345, and 1350. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 1300 also include specialized functional blocks, such as multiply and accumulate block (MAC) 1355 and random access memory block (RAM) 1360. The configuration of the programmable device is specified at least in part by configuration data stored in configuration memory. The configuration data can include values for lookup tables defining the functions of logic cells; values of control signals for multiplexers and other switching devices used by the configurable switching circuit to route signals between inputs, outputs, logic cells, and functional blocks; and values specifying other aspects of the configuration of the programmable device, such as modes of operation of the programmable device and its assorted functional blocks and logic cells. The configuration memory can be a monolithic unit or scattered all over the programmable device. In these types of programmable devices, portions of the configuration memory can lie within the logic cells, functional blocks, and configurable switching circuit of the programmable device.

For clarity, the portion of the programmable device 1300 shown in FIG. 13 only includes a small number of logic cells, LABs, and functional blocks. Typical programmable devices will include thousands or tens of thousands of these elements.

Figure 14:
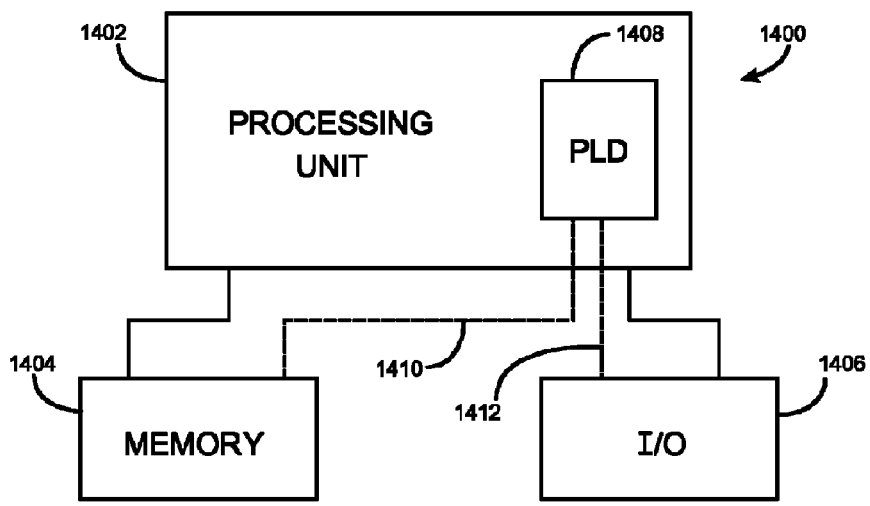
FIG. 14 is a block diagram of an electronic system that is improved by incorporating embodiments of the present invention.

FIG. 14 shows a block diagram of an exemplary digital system 1400, within which the present invention may be embodied. System 1400 can be a programmed digital computer system, digital signal processing system, specialized digital switching network, or other processing system. Moreover, such systems may be designed for a wide variety of applications, such as telecommunications systems, automotive systems, control systems, consumer electronics, personal computers, Internet communications and networking, and others. Further, system 1400 may be provided on a single board, on multiple boards, or within multiple enclosures.

System 1400 includes a processing unit 1402, a memory unit 1404 and an input/output unit 1406 interconnected together by one or more buses. According to this exemplary embodiment, a programmable logic device (PLD) 1408 is embedded in processing unit 1402. PLD 1408 may serve many different purposes within the system in FIG. 14. PLD 1408 can, for example, be a logical building block of processing unit 1402, supporting its internal and external operations. PLD 1408 is programmed to implement the logical functions necessary to carry on its particular role in system operation. PLD 1408 may be specially coupled to memory 1404 through connection 1410 and to input/output unit 1406 through connection 1412.

Processing unit 1402 may direct data to an appropriate system component for processing or storage, execute a program stored in memory 1404, or receive and transmit data via input/output unit 1406, or other similar function. Processing unit 1402 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 1408 can control the logical operations of the system. In an embodiment, PLD 1408 acts as a reconfigurable processor, which can be reprogrammed as needed to handle a particular computing task. Alternately, programmable logic device 1408 may itself include an embedded microprocessor. Memory unit 1404 may be a random access memory (RAM), read only memory (ROM), fixed or flexible disk media, PC card flash disk memory, tape, or any other storage means, or any combination of these storage means.

Further embodiments can be envisioned to one of ordinary skill in the art after reading the attached documents. For example, although the invention has been discussed with reference to programmable devices, it is equally applicable to standard or structured ASICs, gate arrays, and general digital logic devices. In other embodiments, combinations or subcombinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

A recitation of "a", "an" or "the" is intended to mean "one or more" unless specifically indicated to the contrary.

What is claimed is:

1. A programmable device comprising:
    a programmable device core including programmable logic resources; and
    an I/O block coupled with the programmable device core, wherein the I/O block includes an I/O pin adapted to communicate a signal between the programmable device and an external device;
    wherein the I/O block comprises an input circuit coupled with the I/O pin and adapted to receive a double data rate input signal via the I/O pin from the external device, wherein the double data rate input signal includes an odd bit and an even bit in each cycle of a data strobe signal;
    wherein the input circuit comprises:
    a first set of registers coupled with the I/O pin and adapted to capture the double data rate input signal and to output a first single rate data signal corresponding with the odd bit of each cycle of the data strobe signal and a second single data rate signal corresponding with the even bit of each cycle of the data strobe signal, wherein the data strobe signal is synchronized with the external device;
    a second set of registers coupled with the first set of registers and adapted to receive the first and second single data rate signals from the first set of registers and to resynchronize the first and second single data rate signals with a full rate device clock signal to produce first and second resynchronized single data rate signals, wherein the full rate device clock signal is synchronized with the programmable device core; and
    first signal paths adapted to carry the first and second resynchronized single data rate signals, wherein the first signal paths are coupled to the second set of registers and first and second core connections that are coupled with the programmable device core.

2. The programmable device of claim 1, wherein a phase of the full rate device clock signal is selected based on the external device from which a signal is received.

3. The programmable device of claim 2, further comprising:
a third set of registers that have respective inputs selectably coupled with respective outputs of the second set of registers and that are adapted to resynchronize the first and second resynchronized single data rate signals with a zero-phase full rate device clock signal to produce first and second zero-phase single data rate signals; and
second signal paths adapted to carry the first and second zero-phase single data rate signals, wherein the second signal paths are coupled to the third set of registers and the first and second core connections.

4. The programmable device of claim 3, further comprising:
for each external device, a delay chain that receives the zero-phase full rate device clock signal and that selects a phase of the zero-phase full rate device clock signal to output as the full rate device clock signal to clock registers corresponding to that external device.

5. The programmable device of claim 4, wherein the delay chain is process, voltage and temperature (PVT) compensated.

6. The programmable device of claim 4 wherein the phase selection can be controlled using an IO scanchain.

7. The programmable device of claim 3, further comprising a fourth set of registers between the second and third set of registers, wherein the fourth set of registers are synchronized using the full rate device clock signal and are adapted to be dynamically switched in or out to insert a delay for aligning the resynchronized data signals corresponding to different external devices.

8. The programmable device of claim 1, wherein the input circuit further comprises:
a third set of registers that have respective inputs selectably coupled with respective outputs of the second set of registers and that are adapted to receive the first and second resynchronized single data rate signals and to output a first half-rate data signal corresponding with odd cycles of the first resynchronized single data rate signal, a second half-rate data signal corresponding with even cycles of the first resynchronized single data rate signal, a third half-rate data signal corresponding with odd cycles of the second resynchronized single data rate signal, and a fourth half-rate data signal corresponding with even cycles of the second resynchronized single data rate signal;
respective second signal paths between the third set of registers and the first and second core connections and third and fourth core connections that are coupled with at least a portion of the programmable logic resources of the programmable device core; and
a first set of selection circuits that select whether to couple the first signal paths or the second signal paths to the core connections, wherein when the second signal paths are selected, the core connections are adapted to carry the half-rate data signals.

9. The programmable device of claim 1, wherein the full rate device clock signal is derived from the data strobe signal.

10. The programmable device of claim 1, wherein the full rate device clock signal is produced by a clock generation circuit of the programmable device.

11. The programmable device of claim 1, wherein the first, second, third, and fourth half-rate data signals are synchronized with a half-rate clock signal having a frequency that is half of a frequency of the full rate device clock signal.

12. The programmable device of claim 11, wherein the half-rate clock signal is derived from the full rate device clock signal.

13. The programmable device of claim 11, wherein the I/O block further comprises a clock derivation circuit, the clock derivation circuit comprising:
a first clock input circuit adapted to receive input signals including a full rate resynchronization clock and the data strobe signal;
a frequency division circuit connected with the first clock input circuit and adapted to output a first output signal having a frequency that is half of a frequency of a selected received input signal; and
a first clock output circuit adapted to provide the first output signal to the input circuit as the half-rate clock signal.

14. The programmable device of claim 13, wherein the clock derivation further comprises a second clock output circuit adapted to provide the first output signal to the programmable device core as the half-rate clock signal.

15. The programmable device of claim 13, wherein the clock output circuit is adapted to receive a half-rate clock signal from the programmable device core via an alternate clock input and to alternatively provide the received half-rate clock signal to the input circuit as the half-rate clock signal.

16. The programmable device of claim 1, further comprising:
a first bypass path between the I/O pin and one of the core connections, wherein when the first bypass path is selected, the double data rate signal received by the I/O pin are carried by the one core connection to at least a portion of the programmable logic resources of the programmable device core.

17. The programmable device of claim 1, further comprising:
a first pair of bypass paths between the first set of registers and a subset of at least two of the first, second, third, and fourth core connections, wherein a first additional mode of the input circuit selectively connects the first pair of bypass paths with the subset of core connections such that the first and second single rate data signals are carried by the subset of core connections to at least a portion of the programmable logic resources of the programmable device core.

18. The programmable device of claim 1, further comprising:
for each external device, a delay chain that receives a zero-phase full rate device clock signal and that selects a phase of the zero-phase full rate device clock signal to output as the full rate device clock signal to clock registers corresponding to that external device.

19. An I/O block comprising:
a bypass path coupled with an I/O pin and a core connection, wherein the bypass path is adapted to carry a double data rate signal received from the I/O pin to the core connection in response to a selection of the bypass path, wherein the double data rate signal includes an odd bit and an even bit in a cycle of a data strobe signal;
a first plurality of registers coupled with the I/O pin adapted to receive the double data rate signal, and wherein the first plurality of registers is further adapted to output a first single rate data signal and a second single data rate signal associated with the odd bit and the even bit of the cycle of the data strobe signal, respectively;

a second plurality of registers coupled with the first plurality of registers adapted to receive the first and second single data rate signals from the first plurality of registers, and wherein the second plurality of registers is further adapted to resynchronize the first and the second single data rate signals with a full rate device clock signal and output the first and the second resynchronized single data rate signals; and a signal path coupling the second plurality of registers and the core connection, wherein the signal path is adapted to carry the first and the second resynchronized single data rate signals in response to a selection of the signal path.

20. An I/O block comprising:

a first plurality of registers adapted to receive a double data rate signal, wherein the double data rate signal includes an odd bit and an even bit in a cycle of a data strobe signal, wherein the data strobe signal is synchronized with an external device, and wherein the first plurality of registers is further adapted to output a first and a second single data rate signal associated with the odd bit and the even bit of the cycle of the data strobe signal, respectively; and a second plurality of registers coupled with the first set of registers, wherein the second set of registers is adapted to receive the first and second single data rate signals from the first plurality of registers and to resynchronize the first and the second single data rate signals with a full rate device clock signal, wherein the full rate device clock signal is synchronized with a programmable device core, and wherein the second plurality of registers is further adapted to output the first and the second resynchronized single data rate signals.

21. The I/O block of claim 20, further comprising:

a signal path coupled with the second plurality of registers and a core connection, wherein the signal path is adapted to carry the first and the second resynchronized single data rate signals from the second plurality of registers to the core connection.

* * * * *